(12) United States Patent
Ono et al.

(10) Patent No.: US 10,108,084 B2
(45) Date of Patent: Oct. 23, 2018

(54) PELLICLE MEMBRANE, PELLICLE, ORIGINAL PLATE FOR EXPOSURE, EXPOSURE APPARATUS, AND METHOD OF PRODUCING SEMICONDUCTOR DEVICE

(71) Applicant: Mitsui Chemicals, Inc., Minato-ku, Tokyo (JP)

(72) Inventors: Yosuke Ono, Sodegaura (JP); Kazuo Kohmura, Chiba (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 24 days.

(21) Appl. No.: 15/310,830

(22) PCT Filed: May 12, 2015

(86) PCT No.: PCT/JP2015/063634
§ 371 (c)(1),
(2) Date: Nov. 14, 2016

(87) PCT Pub. No.: WO2015/178250
PCT Pub. Date: Nov. 26, 2015

(65) Prior Publication Data
US 2017/0090279 A1    Mar. 30, 2017

(30) Foreign Application Priority Data
May 19, 2014 (JP) ................. 2014-103411

(51) Int. Cl.
G03F 1/64 (2012.01)
G03F 1/62 (2012.01)
G03F 7/20 (2006.01)

(52) U.S. Cl.
CPC .............. *G03F 1/64* (2013.01); *G03F 1/62* (2013.01); *G03F 7/2004* (2013.01)

(58) Field of Classification Search
CPC ............. G03F 1/62; G03F 1/64; G03F 7/2004
USPC .......................................................... 430/5
See application file for complete search history.

(56) References Cited

U.S. PATENT DOCUMENTS

| | | | |
|---|---|---|---|
| 5,793,836 A | 8/1998 | Maldonado et al. | |
| 6,101,237 A | 8/2000 | Miyachi et al. | |
| 7,862,961 B2 * | 1/2011 | Hirayanagi | B82Y 10/00 355/75 |
| 2002/0090558 A1 | 7/2002 | Shirasaki | |
| 2007/0190433 A1 | 8/2007 | Hirayanagi | |

FOREIGN PATENT DOCUMENTS

| | | |
|---|---|---|
| JP | 10-70066 A | 3/1998 |
| JP | 10-92743 | 4/1998 |
| JP | 2002-139826 A | 5/2002 |
| JP | 2002-182373 A | 6/2002 |
| JP | 2005-43895 A | 2/2005 |
| JP | 2009-116284 A | 5/2009 |
| JP | 2010-256434 A | 11/2010 |
| JP | WO 2011/160861 A1 | 12/2011 |
| TW | 200732831 A | 9/2007 |
| WO | WO 2006/137454 A1 | 12/2006 |
| WO | WO 2007/094197 A1 | 8/2007 |
| WO | WO 2014/188710 A1 | 11/2014 |

OTHER PUBLICATIONS

International Search Report (PCT/ISA/210) dated Aug. 18, 2015, by the Japanese Patent Office as the International Searching Authority for International Application No. PCT/JP2015/063634.
Written Opinion (PCT/ISA/237) dated Aug. 18, 2015, by the Japanese Patent Office as the International Searching Authority for International Application No. PCT/JP2015/063634.
Notice of Submission of Opinion issued by the Korean Intellectual Property Office in corresponding Korean Patent Application No. 10-2016-7031149 dated Sep. 15, 2017 (9 pages including partial English translation).
Office Action issued by the Taiwanese Patent Office in corresponding Taiwanese Patent Application No. 104115475 dated Aug. 3, 2018 (8 pages including partial English translation).

* cited by examiner

*Primary Examiner* — Christopher G Young
(74) *Attorney, Agent, or Firm* — Buchanan, Ingersoll & Rooney PC

(57) ABSTRACT

A pellicle membrane includes a film consisting of an organic material and an inorganic material, wherein a region containing an organic material and a region consisting of an inorganic material are present in the same plane of the film, and wherein at least a central portion of the film is a region consisting of an inorganic material, and at least a peripheral edge portion of the film is a region containing an organic material.

17 Claims, 10 Drawing Sheets

US 10,108,084 B2

PELLICLE MEMBRANE, PELLICLE, ORIGINAL PLATE FOR EXPOSURE, EXPOSURE APPARATUS, AND METHOD OF PRODUCING SEMICONDUCTOR DEVICE

TECHNICAL FIELD

The present invention relates to a pellicle membrane, a pellicle including a pellicle membrane, an original plate for exposure including a pellicle, an exposure apparatus including an original plate for exposure, and a method of producing a semiconductor device.

BACKGROUND ART

The trend to a higher integration and miniaturization of a semiconductor device has been accelerated from year to year.

For example, although a pattern with a line width of approximately 45 nm is nowadays formed by excimer exposure, formation of a pattern with a line width of 32 nm or less has been demanded recently along with further miniaturization of a semiconductor device. Conventional excimer exposure can hardly cope with such microfabrication. Therefore, change of exposure light to EUV (Extreme Ultra-Violet) light with a shorter wavelength has been studied.

EUV light has a property of being easily absorbed by any substance.

Therefore, in photolithography using EUV light as exposure light (hereinafter also referred to as "EUV lithography"), exposure is conducted using a catoptric system. Specifically, EUV light is reflected by an original plate corresponding to an exposure pattern, and a resist is exposed by the EUV light as reflected light. In this case, when a foreign substance is stuck to the original plate, EUV light is absorbed by the foreign substance or EUV light is scattered, as a result of which there are cases where a desired pattern is not formed by exposure.

Therefore, protection of an EUV light irradiation surface of an original plate with a pellicle has been studied.

A pellicle is configured to include a pellicle membrane for protecting an EUV light irradiation surface of an original plate, and a pellicle frame (support frame) supporting the pellicle membrane.

A pellicle membrane to be used for EUV lithography is required to have a high permeability with respect to EUV light, and to be resistant to degradation and deformation by EUV light irradiation. As a pellicle membrane satisfying the requirements, a silicon crystal membrane such as a single-crystal silicon membrane (for example, see documents 1 and 2), an aluminum nitride membrane layered on a metal mesh (for example, see document 3), a graphene membrane (for example, see document 4), and the like have been proposed.

Document 1: Japanese Patent Application Laid-Open (JP-A) No. 2010-256434

Document 2: Japanese Patent Application Laid-Open (JP-A) No. 2009-116284

Document 3: Japanese Patent Application Laid-Open (JP-A) No. 2005-43895

Document 4: International Publication No. WO 2011/160861

SUMMARY OF INVENTION

Technical Problem

When a pellicle membrane is irradiated with exposure light such as EUV light, a part of the energy is absorbed by the pellicle membrane. The energy of EUV light absorbed by the pellicle membrane is converted to heat through various relaxation processes. Therefore during exposure, the temperature of a pellicle membrane increases. Therefore, a pellicle membrane is required to have a high heat dissipation performance and a high thermal resistance. Meanwhile, with respect to the single-crystal silicon membrane, the heat dissipation performance is low, and also the melting point is low. Therefore, there is a drawback that the membrane is apt to be damaged during EUV light irradiation. Further, there is another drawback that a single-crystal silicon membrane is expensive due to a complicated production process therefor.

With respect to an aluminum nitride membrane in document 3, since the EUV transmittance is low, there is a drawback that it is not suitable for use in lithography requiring a high EUV transmittance. With respect to a graphene membrane in document 4, since it is an aggregate of crystals with a small size (ordinarily approximately from 100 nm to 1,000 nm), there are drawbacks in that the membrane is brittle, the durability of the membrane is insufficient, and a self-supporting membrane is not obtainable. There is another drawback in that a sufficient strength can be hardly obtained, even when a large number of graphene membranes are layered one on another.

The invention has been made in view of such circumstances and for achieving the following objects.

Namely, an object of the invention is to provide a pellicle membrane which is superior in EUV permeability and durability, and has a self-supporting property.

Another object of the invention is to provide a pellicle including the pellicle membrane, an original plate for exposure including the pellicle, and an exposure apparatus including the original plate for exposure.

Still another object of the invention is to provide a method of producing a semiconductor device using the pellicle membrane.

Solution to Problem

Specific means for achieving the above objects are as follows.

<1> A pellicle membrane, comprising a film consisting of an organic material and an inorganic material, wherein a region containing an organic material and a region consisting of an inorganic material are present in the same plane of the film, and wherein at least a central portion of the film is a region consisting of an inorganic material, and at least a peripheral edge portion of the film is a region containing an organic material.

<2> The pellicle membrane according to <1>, wherein the region containing the organic material is a region consisting of the organic material.

<3> The pellicle membrane according to <1> or <2>, wherein at least one of a glass transition temperature or a melting point of the organic material is 150° C. or higher.

<4> The pellicle membrane according to any one of <1> to <3>, wherein the organic material is at least one compound selected from the group consisting of a polyimide compound, a polyacrylonitrile compound, a polyisocyanate compound, a polyamide compound, a heteroaromatic ring compound, a polyphenylene resin, a polyether resin, a liquid crystal polymer resin, a poly(para-xylylene) resin, a phenol resin, an epoxy resin, and a furan resin.

<5> The pellicle membrane according to any one of <1> to <4>, wherein an aroma c ring equivalent of the organic material is from 3 mmol/g to 15 mmol/g.

<6> The pellicle membrane according to any one of <1> to <5>, wherein the organic material is a polyimide compound.
<7> The pellicle membrane according to <6>, wherein the polyimide compound is an aromatic polyimide including a repeating unit represented by the following General Formula (1):

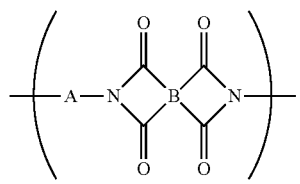

(1)

wherein, in General Formula (1), A is a divalent group derived from a diamine selected from the group consisting of m-phenylenediamine, o-phenylenediamine, p-phenylenediamine, 3,3'-diaminodiphenyl ether, 3,4'-diaminodiphenyl ether, 4,4'-diaminodiphenyl ether, 3,3'-diaminodiphenyl sulfone, 4,4'-diaminodiphenyl sulfone, 3,3'-diaminobenzophenone, 3,3'-diaminodiphenylmethane, 4,4'-diaminodiphenylmethane, 1,3-bis(3-aminophenoxy)benzene, 1,3-bis(4-aminophenoxy)benzene, and 4,4'-bis(3-aminophenoxy)biphenyl; and B is a tetravalent group derived from a tetracarboxylic dianhydride selected from the group consisting of pyromellitic dianhydride, 3,3',4,4'-biphenyltetracarboxylic dianhydride, 2,3,3',4-biphenyltetracarboxylic dianhydride, 3,3',4,4'-benzophenone tetracarboxylic dianhydride, 4,4'-oxydiphthalic dianhydride, and 3,3',4,4'-diphenylsulfone tetracarboxylic dianhydride.
<8> The pellicle membrane according to any one of <1> to <7>, wherein the inorganic material is a carbon material.
<9> The pellicle membrane according to any one of <1> to <8>, further comprising a layer consisting of an inorganic material, on at least one side of the film.
<10> A pellicle, comprising:
the pellicle membrane according to any one of <1> to <9>; and
a support frame supporting the pellicle membrane.
<11> The pellicle according to <10>, wherein a portion of the pellicle membrane that is supported by the support frame is a region containing an organic material.
<12> A pellicle, comprising:
a pellicle membrane comprising a film containing a polyimide compound; and
a support frame supporting the pellicle membrane.
<13> An original plate for exposure, comprising:
an original plate; and
the pellicle according to any one of <10> to <12> mounted on the original plate.
<14> An exposure apparatus, comprising the original plate for exposure according to <13>.
<15> An exposure apparatus, comprising:
a light source that emits exposure light;
the original plate for exposure according to <13>; and
an optical system that guides the exposure light emitted from the light source toward the original plate for exposure,
wherein the original plate for exposure is disposed such that the exposure light emitted from the light source passes through the pellicle membrane and irradiates the original plate.
<16> The exposure apparatus according to <15>, wherein the exposure light is EUV light.

<17> A method of producing a semiconductor device, the method comprising:
a step of causing exposure light emitted from a light source to pass through the pellicle membrane of the original plate for exposure according to <13>, irradiate the original plate, and be reflected from the original plate; and
a step of causing the exposure light reflected from the original plate to pass through the pellicle membrane and irradiate a sensitive substrate, thereby patternwise exposing the sensitive substrate.
<18> The method of producing a semiconductor device according to <17>, wherein the exposure light is EUV light.

Advantageous Effects of Invention

According to the invention, it is possible to provide a pellicle membrane which is superior in EUV permeability and durability, and has a self-supporting property.
Further, according to the invention, it is possible to provide a pellicle including the pellicle membrane, an original plate for exposure including the pellicle, and an exposure apparatus including the original plate for exposure.
Further, according to the invention, it is possible to provide a method of producing a semiconductor device using the pellicle membrane.

DESCRIPTION OF EMBODIMENTS

Figure 1:
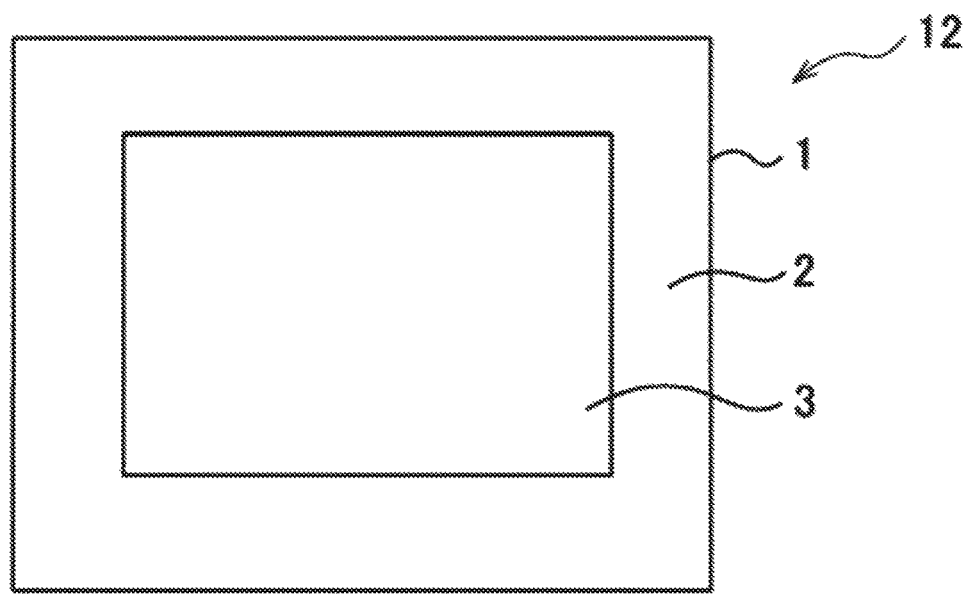
FIG. 1 is a schematic top view of a pellicle membrane according to the embodiment.

Embodiments of the invention will be described below referring appropriately to drawings, provided that the invention is not limited to a specific embodiment as described in a drawing or the like. Elements common to respective drawings may have the same reference numerals, and a duplicated description may be omitted.

Pellicle Membrane

A pellicle membrane according to an embodiment of the invention will be described by way of FIG. 1. FIG. 1 is a schematic top view of a pellicle membrane 12 according to the embodiment.

The pellicle membrane 12 includes a film 1 consisting of an organic material and an inorganic material, and a region 2 containing an organic material and a region 3 consisting of an inorganic material are present in the same plane of the film 1, wherein at least the central portion of the film 1 is the region 3 consisting of an inorganic material, and at least the peripheral edge portion of the film 1 is the region 2 containing an organic material.

A pellicle membrane according to the embodiment is especially suitable for producing a pellicle for lithography using an exposure light with a short wavelength (for example, EUV light, light with a wavelength shorter than EUV light, or the like).

In the embodiment, EUV (Extreme Ultra Violet) light means light with a wavelength of from 5 nm to 30 nm.

The wavelength of EUV light is preferably from 5 nm to 13.5 nm.

In the embodiment, EUV light, and light with a wavelength shorter than EUV light may be collectively called as "FUN light or the like".

A film 1 has a region 2 containing an organic material and a region 3 consisting of an inorganic material in the same plane, wherein the central portion of the film 1 is the region 3 consisting of an inorganic material, and the peripheral edge portion of the film 1 is the region 2 containing an organic material. Since the central portion of the film 1 is the region 3 consisting of an inorganic material, a pellicle membrane 12 including the film 1 is superior in EUV permeability as well as durability, and the transmittance does not change even after long-time irradiation with EUV light.

Meanwhile, a pellicle membrane, in which the peripheral edge portion of the film is a region consisting of an inorganic material, is brittle and can hardly be self-supporting. On the other hand, the pellicle membrane 12, in which the peripheral edge portion of the film 1 is the region 2 containing an organic material, has a self-supporting property.

"Self-supporting" means herein that a membrane shape can be maintained by itself.

Further, the region 3 consisting of an inorganic material that is the central portion of the film 1 preferably has a larger area than an exposure area of the film to be irradiated with an exposure light in a lithography step. Although there is no particular restriction on the size of the region 3, it is preferably a region of from 100 mm to 110 mm in the transverse direction and from 130 mm to 144 mm in the longitudinal direction excluding a region of approximately from 1 mm to 2 mm from the peripheral edge. There is no particular restriction on the shape of the region 3, and it may be elliptical, circular, rectangular, square, or a shape combining a straight line and a curve.

A region containing an organic material present in the peripheral edge portion of a film may contain a material other than an organic material (for example, an inorganic material). In this regard, for securing a favorable self-supporting property of a pellicle membrane, the content of an organic material in a region containing an organic material is preferably 50% by mass or more with respect to the total mass of the region, more preferably 70% by mass or more, and still more preferably 90% by mass or more. Furthermore, the content of an organic material in a region containing an organic material is particularly preferably 100% by mass with respect to the total mass of the region. In other words, a region containing an organic material is particularly preferably a region consisting of an organic material.

Organic Material

As an organic material, an organic substance containing carbon may be used.

Further, an organic material which can be carbonized by application of high energy is preferable. Accordingly, when high energy is applied to a partial region of a film containing an organic material, an organic material in the energized region is carbonized, so that each of a region containing an organic material (a not energized region) and a region consisting of an inorganic material (an energized region) can be provided in the same plane.

At least one of the glass transition temperature or the melting point of an organic material is preferably 150° C. or higher. In this regard, at least one of the glass transition temperature or the melting point of the organic material is more preferably 300° C. or higher, and still more preferably 450° C. or higher. In a case in which at least one of the glass transition temperature or the melting point of the organic material is 150° C. or higher, when EUV light absorbed by a pellicle membrane during exposure is converted to heat to raise the temperature of the pellicle membrane high, occurrence of flow or deformation of the pellicle membrane due to generated heat can be suppressed. Therefore, a pellicle membrane superior in thermal resistance can be obtained, in which generation of a wrinkle or a hole in a region irradiated with EUV light is suppressed.

More specifically, in a case in which irradiation is made with EUV light as an exposure light, EUV light absorbed by a pellicle membrane is converted to heat, and the temperature thereof may reach temporarily 250° C. or higher. However, by selecting at least one of the glass transition temperature or the melting point of an organic material at 150° C. or higher, occurrence of flow or deformation of the pellicle membrane due to generated heat can be suppressed favorably. Therefore, generation of a wrinkle or a hole in a region irradiated with EUV light can be suppressed favorably.

Figure 2:
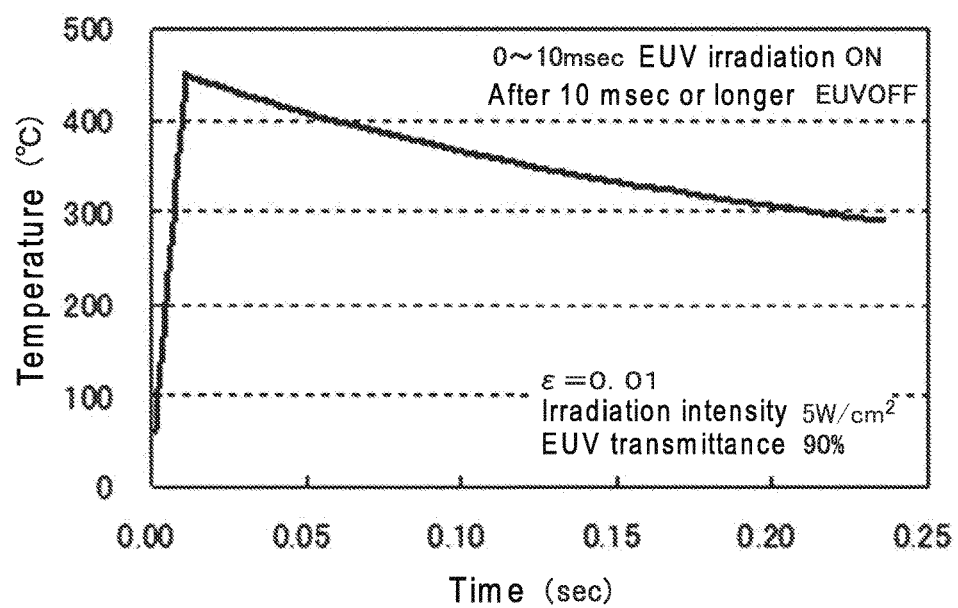
FIG. 2 is a graph showing the relationship between the temperature of a pellicle membrane and the elapsed time when the pellicle membrane is irradiated with EUV light.

Next, the relationship between the temperature of a pellicle membrane and the elapsed time, when the pellicle membrane is irradiated with EUV light as an exposure light, will be described by way of FIG. 2. FIG. 2 is a graph showing the relationship between the temperature of a pellicle membrane and the elapsed time, when a pellicle membrane with a transmittance of 90%, a membrane thickness of 20 nm, and an emissivity of 0.01 is irradiated with EUV light with an irradiation intensity of 5 W/cm$^2$ for 10 msec. The graph is calculated assuming that EUV light absorbed by a pellicle membrane is entirely converted to heat. As shown in FIG. 2, the temperature of a pellicle membrane rises up to 450° C. from 0 msec to 10 msec, during which EUV light irradiation is carried out, and as soon as EUV light irradiation is terminated (after 10 msec or longer), the temperature of the pellicle membrane declines. Since a high temperature of a pellicle membrane is anticipated during EUV light irradiation as seen above, it is preferable that a pellicle membrane has a superior thermal resistance.

A melting point and a glass transition temperature may be measured using, for example, a differential scanning calorimetric analyzer (Model DSC-7, produced by Perkin Elmer) by a method according to JIS K7121(1987), and the temperature increase rate may be set at 10° C./min.

There is no particular restriction on an organic material in which at least one of the glass transition temperature or the melting point is 150° C. or higher, and examples include at least one compound selected from the group consisting of an aromatic polyimide, a straight chain aliphatic polyimide, polyetherimide, poly(phenylene sulfone), poly(phenylene ether), polyether sulfone, poly(ether ether ketone), a liquid crystal polymer, polyethylene terephthalate), an aromatic polyamide, parylene, polyacrylonitrile, and a polymer compound including a heteroaromatic ring.

An organic material is preferably a resin which does not cause a degradation reaction through EUV light irradiation, and is preferably any one of a chain polymer without a tertiary carbon, a crosslinked product of a chain polymer without a tertiary carbon, or a polymer in which 3 aromatic rings bond directly to a tertiary carbon. "A crosslinked product of a chain polymer without a tertiary carbon" means a crosslinked product formed by crosslinking "chain polymers without a tertiary carbon" and also includes a crosslinked product of a chain polymer which has come to have a tertiary carbon as the result of crosslinking.

In this regard, when an organic material constituting a pellicle membrane is irradiated with EUV light, the EUV light interacts with an inner shell electron of carbon, oxygen, or nitrogen in the organic material, so that a nucleus thereof may be ionized by releasing a secondary electron, or a radical species or an electron excited species may be generated. Therefore, in the case of a chain polymer without a tertiary carbon, a crosslinking reaction or a degradation reaction by an ion species, a radical species, or an excited species can be better suppressed compared to a chain polymer with a tertiary carbon. Further, in the case of a C—C bond including a tertiary carbon generated by crosslinking a chain polymer without a tertiary carbon, or a tertiary carbon bonded directly with 3 aromatic rings, a crosslinking reaction or a degradation reaction occurs less easily compared to a C—C bond of a chain polymer with a tertiary carbon.

Further, an organic material more preferably includes in the molecule a conjugate structure, such as an aromatic ring or an imide ring. An organic material including a conjugate structure in the molecule forming a pellicle membrane is able to transform to a stable carbon structure, when a crosslinking reaction occurs by energy of absorbed ionizing radiation, or heat.

In a case in which an organic material includes an aromatic ring in the molecule, the aromatic ring equivalent of the organic material is preferably from 3 mmol/g to 15 mmol/g, more preferably from 5 mmol/g to 12 mmol/g, and still more preferably from 7 mmol/g to 10 mmol/g. An aromatic ring equivalent means herein a value obtained by dividing the number of an aromatic ring included in one molecule of an organic compound b the molecular weight, and the calculation equation therefor is as follows.

Aromatic ring equivalent (mmol/g)=[number of aromatic ring included in one molecule/molecular weight (g/mol)]×1000    [Equation]

As an organic material, at least one compound selected from the group consisting of a polyimide compound, a polyacrylonitrile compound, a polyisocyanate compound, a polyamide compound, a heteroaromatic ring compound, a polyphenylene resin, a polyether resin, a liquid crystal polymer resin, a poly(para-xylylene) resin, a phenol resin, an epoxy resin, and a furan resin, is preferable. By using a compound listed above and forming a region containing an organic material in the peripheral edge portion of a film, a self-supporting property can be favorably imparted to a pellicle membrane.

Further, when high energy is applied to the organic material, the material can be carbonized favorably, and therefore a pellicle membrane including a film, in which a region consisting of an inorganic material containing carbon (carbon material) and a region containing an organic material are present, can be produced favorably.

As an organic material, a polyimide compound is more preferable. By using a polyimide compound and forming a region containing an organic material in the peripheral edge portion of a film, a self-supporting property can be more favorably imparted to a pellicle membrane.

Further, when energy is applied to a polyimide compound, it can be carbonized easily, and therefore a pellicle membrane including a film, in which a region consisting of an inorganic material containing carbon and a region containing an organic material are present, can be produced more favorably.

As a polyimide compound, an aromatic polyimide is preferable. As an aromatic polyimide, a polyimide which causes a crosslinking reaction without causing a degradation reaction when it is heated to 600° C. or higher or irradiated with ionizing radiation or the like is preferable. From a viewpoint of suppression of a degradation reaction of a polymer film (a film consisting of an organic material), it is more preferable that a tertiary carbon or a fluorine atom is not included in a molecular structure forming a polymer film.

Further, as an aromatic polyimide, a polyimide which has a rigid and linear molecular structure so that molecular chains align spontaneously in a plane is desirable. A polyimide with a molecular structure having a rigid and linear structure aligns spontaneously in a plane in a membrane producing process for a polyimide thin membrane (a film consisting of a polyimide). When energy, such as heat or ionizing radiation, is applied to a highly-aligned polyimide membrane, a carbonization reaction advances while maintaining alignment, and therefore a carbonized polyimide membrane is superior in membrane strength.

Examples of compounds to be used for forming an aromatic polyimide having a rigid and linear molecular structure include, as an acid anhydride, pyromellitic anhydride, and 3,3',4,4'-biphenyltetracarboxylic dianhydride. As a diamine, a compound having a substituent at a para position with respect to an aromatic ring is preferable, and examples thereof include p-phenylenediamine, 4,4'-diaminodiphenyl ether, 4,4'-diaminodiphenylmethane, and 4,4'-diaminodiphenylsulfone. The polyimide formed from the acid anhydride and diamine has a rigid and linear molecular structure, and by using the polyimide, a polyimide thin membrane aligned spontaneously in a plane can be obtained.

As an index showing the degree of in-plane alignment of a polyimide membrane, a birefringence in the thickness direction or a phase difference (=thickness×birefringence) can be used. A birefringence in the thickness direction can be assessed using a phase difference measuring apparatus. The birefringence of a polyimide membrane in the thickness direction is preferably 0.05 or more, and more preferably 0.1 or more.

For measuring a birefringence in the thickness direction, a publicly known phase difference measuring apparatus, such as ABR-10A, ABR-22, or ABR-30 produced by Uniopt Co., Ltd., may be used.

A polyimide compound is more preferably an aromatic polyimide including a repeating unit represented by the following General Formula (1).

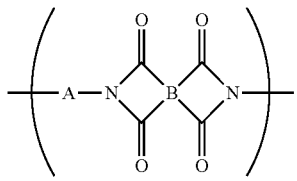

(1)

In General Formula (1), A is a divalent group derived from an aromatic diamine selected from the group consisting of m-phenylenediamine, o-phenylenediamine, p-phenylenediamine, 3,3'-diaminodiphenyl ether, 3,4'-diaminodiphenyl ether, 4,4'-diaminodiphenyl ether, 3,3'-diaminodiphenylsulfone, 4,4'-diaminodiphenylsulfone, 3,3'-diaminobenzophenone, 3,3'-diaminodiphenylmethane, 4,4'-diaminodiphenylmethane, 1,3-bis(3-aminophenoxy)benzene, 1,3-bis(4-aminophenoxy)benzene, and 4,4'-bis(3-aminophenoxy)biphenyl.

B is a tetravalent group derived from a tetracarboxylic dianhydride selected from the group consisting of pyromellitic dianhydride, 3,3',4,4'-biphenyltetracarboxylic dianhydride, 2,3,3',4-biphenyltetracarboxylic dianhydride, 3,3',4,4'-benzophenone tetracarboxylic dianhydride, 4,4'-oxydiphthalic dianhydride, and 3,3',4,4'-diphenylsulfone tetracarboxylic dianhydride.

An aromatic polyimide may include one or more kinds of divalent group derived from a diamine other than a group derived from the above-described aromatic diamine, and one or more kinds of tetravalent group derived from a tetracarboxylic dianhydride other than a group derived from the above-described tetracarboxylic dianhydride, to the extent that a desired physical property or the like is not impaired.

A polyimide compound can be formed favorably by a reaction between an acid anhydride and a diamine.

A specific structure of an acid anhydride for forming a polyimide compound is as follows.

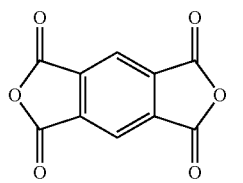

PMDA: pyromellitic anhydride

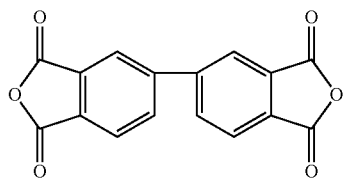

s-BPDA: 3,3',4,4'-biphenyltetracarboxylic dianhydride

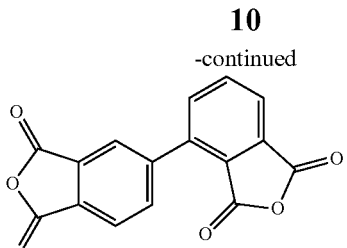

a-BPDA: 2,3,3',4,-biphenyltetracarboxylic dianhydride

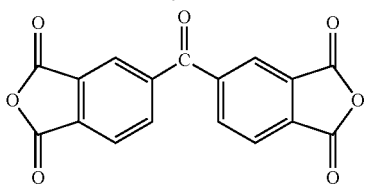

BTDA: 3,3',4,4'-benzophenone tetracarboxylic dianhydride

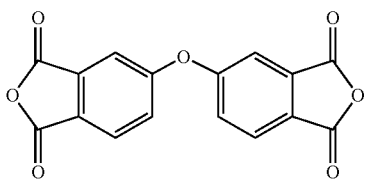

ODPA: 4,4'-oxydiphthalic dianhydride

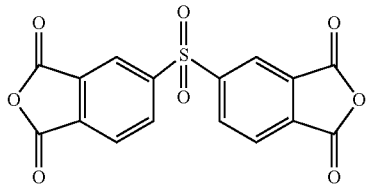

DSDA: 3,3'4,4'-diphenylsulfone tetracarboxylic dianhydride

Meanwhile, a specific structure of a diamine for forming a polyimide compound is as follows.

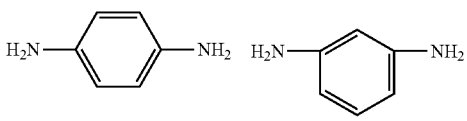

p-phenylenediamine      m-phenylenediamine

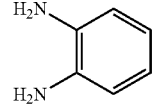

o-phenylenediamine

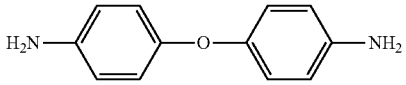

4,4'-diaminodiphenyl ether

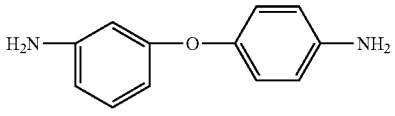

3,4'-diaminodiphenyl ether

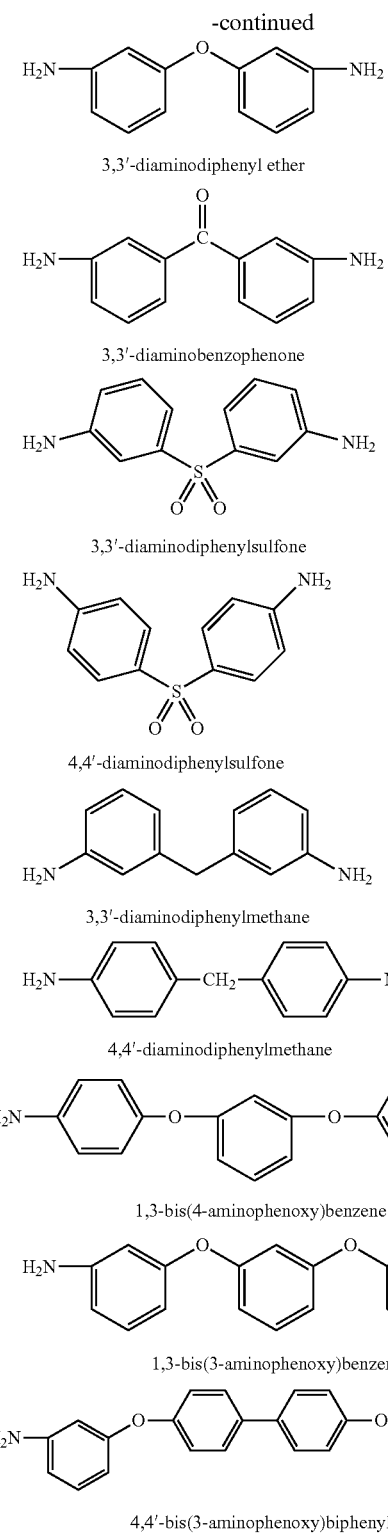

3,3'-diaminodiphenyl ether 3,3'-diaminobenzophenone 3,3'-diaminodiphenylsulfone 4,4'-diaminodiphenylsulfone 3,3'-diaminodiphenylmethane 4,4'-diaminodiphenylmethane 1,3-bis(4-aminophenoxy)benzene 1,3-bis(3-aminophenoxy)benzene 4,4'-bis(3-aminophenoxy)biphenyl A pellicle membrane according to the embodiment may be a monolayer structure, namely a structure consisting of a single film, or a structure consisting of 2 or more layers.

Further, a pellicle membrane may have a layer consisting of an inorganic material on at least one side of the film. Examples of a layer consisting of an inorganic material include an oxidation prevention layer.

Oxidation Prevention Layer

With respect to a pellicle membrane according to the embodiment, an oxidation prevention layer may be layered on at least one side of the film. When an oxidation prevention layer is layered on a film, oxidation of a pellicle membrane is suppressed during EUV light irradiation or storage of the pellicle.

There is no particular restriction on the type of an oxidation prevention layer, insofar as it is a layer consisting of a material stable with respect to EUV light. It may be, for example, a layer consisting of $SiO_x$ ($x \leq 2$), $Si_xN_y$ (x/y is from 0.7 to 1.5), SiON, $Y_2O_3$, YN, Mo, Ru, Rb, Sr, Y, Zr, Nb, or Rh.

The thickness of an oxidation prevention layer is preferably approximately from 1 nm to 10 nm, and more preferably approximately from 2 nm to 5 nm, so as not to retard EUV light permeation. By limiting the thickness of an oxidation prevention layer to approximately from 1 nm to 10 nm, absorption of EUV light by an oxidation prevention layer can be suppressed and decrease in transmittance can be suppressed.

The ratio of the thickness of an oxidation prevention layer to the thickness of a pellicle membrane is desirably in a range of from 0.03 to 1.0. In the numerical range, absorption of EUV light by an oxidation prevention layer can be suppressed and decrease in transmittance can be suppressed.

When an oxidation prevention layer is layered, reflection of EUV light occurs at newly formed interfaces, namely an interface between the oxidation prevention layer and air, and an interface between the oxidation prevention layer and a pellicle membrane, and the transmittance may decrease. The reflectance of EUV light at the interfaces can be calculated according to the thicknesses of the pellicle membrane and the oxidation prevention layer as well as the kinds of elements constituting the pellicle membrane and the oxidation prevention layer. Further, by optimizing the membrane thickness, the reflectance can be decreased similarly to the principle of an antireflection membrane.

With respect to the thickness of an oxidation prevention layer, an optimum thickness is desirably selected within a range where decrease in transmittance of EUV light by absorption and decrease in transmittance of EUV light by reflection can be suppressed, and performance of oxidation prevention can be secured.

There is no particular restriction on the thickness uniformity and the surface roughness of an oxidation prevention layer. An oxidation prevention layer may be either of a continuous structure or a sea-island structure, the membrane thickness may be uneven, and the surface may be rough, insofar as a trouble from nonuniformity of the transmittance or scattering of EUV light due to the nonuniformity of the membrane thickness or the surface roughness does not occur in a step of patterning by EUV exposure.

The average refractive index of a pellicle membrane combining a pellicle membrane and an oxidation prevention layer is desirably in a range of from 1.9 to 5.0. A refractive index can be measured by a technique such as spectroscopic ellipsometry. The average density of a pellicle membrane combining a pellicle membrane and an oxidation prevention layer is desirably in a range of from 1.5 g/cm³ to 5.0 g/cm³. A density can be measured by a technique such as X-ray reflectometry.

The thickness of a pellicle membrane (in a case in which it consists of 2 or more layers, the total thickness) may be, for example, from 10 nm to 200 nm, preferably from 10 nm to 100 nm, more preferably from 10 nm to 70 nm, and still more preferably from 10 nm to 50 nm.

Inorganic Material

An inorganic material is preferably a carbon material. As a carbon material, for example, amorphous carbon and graphite are preferable.

The structure of a region consisting of a carbon material may not be a structure in which connected bodies of 6-membered rings are arranged regularly in the c axis direction as in the case of a graphite structure described below. In other words, it may be an amorphous carbon structure with an X-ray diffraction pattern different from that of a graphite structure. Further, it may include an $sp^3$ bond in addition to an $sp^2$ bond, and it may contain in addition to carbon and hydrogen a third component element, such as oxygen or nitrogen.

Graphite, for example, consists only of carbon, and the refractive index for light with a wavelength of 550 nm is from 2.0 to 3.0.

Figure 3:
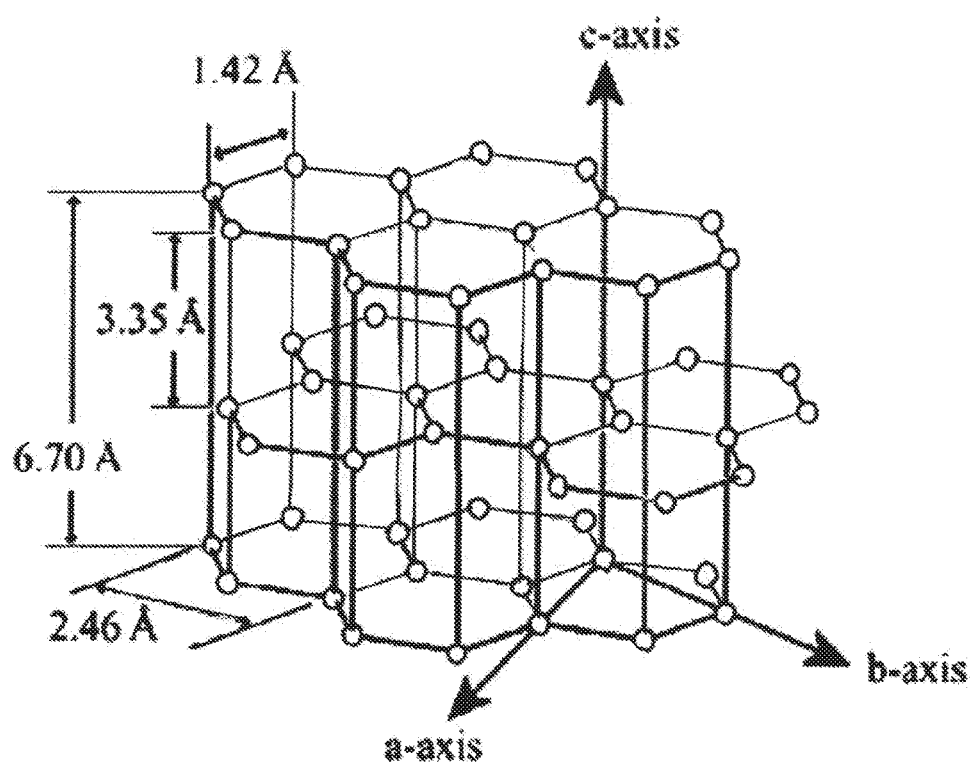
FIG. 3 is an explanatory diagram showing the crystal structure of graphite.

FIG. 3 is a schematic diagram of the crystal structure of graphite. As shown in FIG. 3, a graphite crystal has a structure in which a large number of connected bodies of 6-membered rings of $sp^2$ carbon atoms are layered one on another in the c axis direction. According to the invention, graphite is limited to a compound in which connected bodies of 6-membered rings are arranged regularly in the c axis direction, and a material in which connected bodies are not arranged regularly in the c axis direction, such as a layered product of graphene, is not included in graphite. A part of graphite may contain nitrogen, silicon, an $sp^3$ carbon atom, or the like.

Graphite may have a single-crystal structure or a polycrystal structure. Graphite with a single-crystal structure is preferable in terms of high strength and high thermal conductivity. On the other hand, graphite with a polycrystal structure is preferable in terms of easy production and low cost.

The mosaic spread of graphite is preferably 5.0 or less, more preferably from 0.1 to 3.0, and still more preferably from 0.1 to 1.0. When the mosaic spread is 5.0 or less, graphite can be superior in strength and heat dissipation performance. Mosaic spread is an index showing the alignment of crystallites in graphite in the c axis direction. A lower value of mosaic spread indicates higher alignment in the c axis direction. When a value of mosaic spread is large, namely when the alignment of crystallites in graphite in the c axis direction is low, connected bodies of 6-membered rings cannot align regularly in the c axis direction, and graphite is apt to become brittle.

For example, a mosaic spread of 0.3° indicates that deviation of the c axis from the direction vertical to a connected body of 6-membered rings (plate surface) is within approximately ±0.6° ("Carbon Yogo-Jiten (Terminological Dictionary on Carbon Materials)", edited by Yasuda Keiichi, and Kobayashi Kazuo of the editorial committee for "Carbon Yogo-Jiten" of The Carbon Society of Japan, Agne Shofu Publishing Inc., 2000). A mosaic spread can be regulated by temperature or pressure during a firing process in producing a region consisting of graphite.

A mosaic spread can be measured using an X-ray diffraction apparatus according to the following procedures. A counter (2θ axis) of an X-ray diffraction apparatus is fixed at a position showing the peak of the X-ray diffraction line of (002) plane of plate-shaped graphite. Then only a sample (θ axis) is rotated and an intensity function (a sample orientation angle-dependent curve of peak intensity of the (002) plane diffraction line) is measured. A half value of peak intensity is determined from the obtained intensity function and defined as a mosaic spread.

A region consisting of a carbon material, such as amorphous carbon or graphite, can be formed by applying high energy to a region containing an organic material and carbonizing the region.

Therefore, by applying high energy to the central portion of a film containing an organic material (preferably, a film consisting of an organic material) and carbonizing the organic material in the energized region, a pellicle membrane in which the central portion of a film is a region consisting of an inorganic material (carbon material) can be produced. A region in the film where high energy has not been applied is a region containing an organic material, and when at least the peripheral edge portion of the film is a region containing an organic material, a pellicle membrane with a self-supporting property can be produced.

A region consisting of graphite is preferably highly oriented pyrolytic graphite (HOPG), which is formed according to the above method and a subsequent re-annealing under pressure at a high temperature for a long time. The mosaic spread of highly oriented pyrolytic graphite obtained by re-annealing for a long time becomes very small.

As a carbon material, amorphous carbon is preferable from a viewpoint of production easiness (for example, because a region consisting of a carbon material can be formed at a lower temperature).

Method of Producing Pellicle Membrane

There is no particular restriction on a method of producing a pellicle membrane according to the invention, and a production example of a pellicle membrane is described below.

(Method in which Sacrificial Layer is Layered on Substrate and Removed Later.)

A sacrificial layer is layered on a substrate, a membrane containing an organic material (preferably, a membrane consisting of an organic material; the membrane may be a film) is formed thereon, then the sacrificial layer is removed to obtain a self-supporting membrane. A sacrificial layer may be a metal, an oxidized membrane, a resin, a salt, or the like, which can be removed by a specific treatment method. A sacrificial layer may be, for example, a metal such as aluminum which is dissolved in an acidic solution. Specifically, a metallic layer is layered on a surface of a glass substrate or a silicon wafer by vapor deposition, sputtering, or the like; further a membrane is layered on the metallic layer; and then the stack is immersed in a solution such as an acidic solution which can dissolve the metallic layer to separate the membrane from the substrate.

In a case in which a silicon wafer with a natural oxide membrane or a silicon oxide layer is used as a substrate, a membrane containing an organic material is coated on the natural oxide membrane or the silicon oxide layer on a silicon wafer, and then the product in process is immersed in a hydrofluoric acid aqueous solution to remove the natural oxide membrane or the silicon oxide layer, and to separate the membrane from the substrate.

A sacrificial layer to be layered on a substrate may be a water-soluble material, such as a partially saponified poly (vinyl alcohol) resin or a salt like sodium chloride. When a membrane containing an organic material is layered on a sacrificial layer and then the layered body is immersed in water, a pellicle membrane can be separated from the substrate.

In selecting a method for removing a sacrificial layer layered on a substrate, any most suitable technique can be selected according to characteristics such as the processing resistance of a membrane containing an organic material, the membrane strength, the removal speed of a sacrificial layer, and the uniformity of the membrane thickness and the surface roughness of a sacrificial layer.

A pellicle membrane in which the central portion of a film is a region consisting of an inorganic material (carbon material) and the peripheral edge portion of the film is a region containing an organic material can be produced by separating a membrane containing an organic material and then applying high energy to the central portion of the membrane to carbonize the organic material in the energized region.

(Method for Etching or Dissolving Substrate)

In a case in which a substrate material is a metal, an oxidized membrane, a resin, a salt, or the like that can be removed by a specific treatment method, a membrane can be obtained by layering a membrane containing an organic material on a substrate, and thereafter etching or dissolving the substrate.

For example, in a case in which a copper foil is used as a substrate, a membrane can be obtained by layering a membrane containing an organic material on a surface of the copper foil, and thereafter removing the substrate by immersing the stack in a cupric chloride etching solution to etch the copper foil substrate.

In a case in which a glass substrate is used as a substrate, a membrane can be obtained by layering a membrane containing an organic material on the glass substrate, and thereafter by etching the glass substrate with hydrofluoric acid to remove the substrate.

In a case in which a silicon wafer is used as a substrate, a membrane can be obtained by layering a membrane containing an organic material on the silicon wafer, and thereafter by etching the silicon wafer by wet etching or dry etching to remove the silicon wafer. For wet etching, an etching solution, such as KOH, TMAH, or hydrazine, may be used. For dry etching, an etching gas, such as a fluorine type ($SF_6$, $CF_4$, $NF_3$, $PF_5$, $BF_3$, $CHF_3$, or $XeF_2$), a chlorine type ($Cl_2$, or $SiCl_4$), or a bromine type (IBr), may be used. Since the wet etching speed depends on the temperature, it is preferable to lower the etching rate by lowering the liquid temperature, so that etching can be performed without damaging a thin membrane containing an organic material on a silicon wafer.

In a case in which a silicon wafer is dry etched, a layer such as an etch stop layer may be provided in advance on a surface of the silicon substrate. Examples of an etch stop layer include a layer consisting of $SiO_2$ or SiN. An etch stop layer preferably consists of a membrane inducing a tensile stress. As a residual stress that acts in the direction parallel to the surface of a substrate and a thin membrane, there are tensile stress and compression stress. It is a tensile stress, when a force works inside a thin membrane to extend the thin membrane, meanwhile it is a compression stress, when a force works inside a thin membrane to contract the thin membrane. Such a stress appears mainly in a membrane producing process for a thin membrane. The difference in coefficient of thermal expansion between a substrate and a thin membrane is one of factors for generating a residual stress. In returning to room temperature, both a substrate and a thin membrane contract; however their contraction rates are different due to different coefficients of thermal expansion. When the coefficient of thermal expansion of a thin membrane is larger than the coefficient of thermal expansion of a substrate, a tensile stress appears; and in the reverse case, a compression stress appears. A membrane in which a tensile stress appears is preferable, because a tension works on a membrane containing an organic material provided on the membrane, so that a membrane without a wrinkle can be formed. Since a layer consisting of SiN generates a tensile stress, a membrane containing an organic material to be obtained by dry etching a silicon wafer can be a membrane free from a wrinkle. By removing an etch stop layer after completion of dry etching of a silicon wafer, a targeted self-supporting membrane can be obtained.

In a case in which the substrate is a substrate consisting of a salt such as sodium chloride, a membrane can be obtained by layering a membrane containing an organic material on a substrate surface, and then immersing the layered product in water for etching the substrate to remove the substrate. In a case in which the substrate is a plastic substrate, a membrane can be obtained by layering a membrane containing an organic material on a plastic substrate surface, and then immersing the layered product in a solvent able to dissolve the plastic substrate for dissolving the plastic substrate.

A pellicle membrane in which the central portion of a film is a region consisting of an inorganic material (carbon material) and the peripheral edge portion of the film is a region containing an organic material can be produced by obtaining a membrane containing an organic material and then applying high energy to the central portion of the membrane so as to carbonize the organic material in an energized region.

(Method for Conducting Pretreatment for Easy Separation on Substrate Surface)

By conducting a surface treatment on a substrate for regulating interaction between a membrane containing an organic material and a substrate surface, the membrane can be separated easily from the substrate by immersion in a solvent or by a mechanical separation process. Examples of a method for regulating interaction between a membrane containing an organic material and a substrate surface include a method of surface treatment with a silane coupling agent. Further, a method in which a substrate surface is cleaned with water or an organic solvent, a piranha solution, sulfuric acid, a UV ozone treatment, or the like is included. In a case in which a substrate is a silicon wafer, a solution used in a RCA cleaning method, such as a mixture liquid of hydrogen peroxide water and ammonium hydroxide, or a mixture liquid of hydrochloric acid and hydrogen peroxide water, may be used.

For membrane formation of a sacrificial layer, or a surface treatment on a substrate, respective methods for etching or dissolving a substrate may be used in a combination. It is preferable that a substance to be used for a sacrificial layer or a surface treatment is one that will not remain easily on a surface of or inside a membrane containing an organic material, and can be removed by an easy method, even if some residue remains. Examples of methods for removal include etching with a gas, evaporation by heating, washing with a solvent, and removal by degradation with light, and the above may be used in a combination.

(Method for Forming Region Consisting of Carbon Material)

Next, a method in which high energy is applied to a membrane containing an organic material for carbonizing an organic material in an energized region to form a region consisting of a carbon material will be described.

Examples of a method for forming a region consisting of a carbon material include a method in which high energy is applied to a polymer film containing a compound such as a polyimide compound, a polyacrylonitrile compound, a polyisocyanate compound, a polyamide compound, a heteroaromatic ring compound, a polyphenylene resin, a polyether resin, a liquid crystal polymer resin, a poly(para-xylylene) resin, a phenol resin, an epoxy resin, or a furan resin to convert the film to a film including a region consisting of a carbon material. As a method for applying high energy, a method for firing at a high temperature, or a method of irradiation with radiation is preferable.

Examples of a method for firing at a high temperature include a method for heating with a high temperature heating oven, and a method for heating a film by irradiating the film with ultraviolet light or visible light laser, or infrared light. For purpose of retaining a region containing an organic material in the peripheral edge portion of a film, and heating a film locally, a method in which a film is heated by irradiating the film with ultraviolet light or visible light laser, or infrared light is preferable.

Examples of radiation for irradiation include EUV light, an X-ray, a γ-ray, an electron beam, a neutron beam, and an ion beam (heavy charged particle beam), and particularly use of EUV light is preferable. When a polymer film is irradiated with radiation, the radiation interacts with a substance constituting the film to impart energy to an atom in the film. By the energy, an atom may be excited or ionized, a secondary electron may be emitted, or various chemical reactions may be caused. As the result, an organic material of a region of a polymer film, where high energy is applied, is carbonized, so that a film including a region consisting of a carbon material is obtained.

In a case in which a polymer film is carbonized by irradiation with a high intensity EUV light, carbonization of a polymer film advances for 2 reasons. A reason is that due to the EUV light energy, an atom is excited or ionized, and a secondary electron is emitted, which advance carbonization. The other reason is that the EUV light energy absorbed by a film is converted to heat and the temperature of a polymer film exceeds the thermal decomposition temperature to cause carbonization.

Therefore, carbonization by EUV light irradiation is preferable, because carbonization is promoted not only by the carbonizing effect of the energy of EUV light, but also by the carbonizing effect of heat as described above.

Carbonization of a polymer film is preferably carried out by irradiating a polymer film with EUV light and heating to a temperature of from 600° C. to 1,000° C. By these processes, the structure of a region irradiated with EUV light is changed to progress carbonization of a polymer film, so that a region consisting of a carbon material, and especially a region consisting of an amorphous carbon can be formed favorably.

Carbonization of a polymer film may be conducted at any step of a pellicle production process. For example, carbonization may be conducted immediately after coating a polymer film on an oxidation prevention layer, or carbonization may be conducted either after layering a polymer film on a substrate, or after separating a polymer film from a substrate. Further, carbonization may be conducted also in a state where a polymer film is fixed on a support frame.

A region to be carbonized of a polymer film corresponds to a region to which energy is applied. With respect to a polymer film, a region excluding the peripheral edge portion is preferably a region to which energy is to be applied. For example, a region of a polymer film of from 100 mm to 110 mm in the transverse direction and from 130 mm to 144 mm in the longitudinal direction excluding a region of approximately from 1 mm to 2 mm from the peripheral edge may be carbonized.

There is no particular restriction on the shape of a region to be carbonized in a polymer film, and it may be, for example, elliptical, circular, rectangular, square, or a shape combining a straight line and a curve.

(Structure of Region Consisting of Carbon Material)

The structure of a region consisting of a carbon material can be examined by using a measuring method, such as a Raman spectroscopy method, a Fourier transform infrared spectrophotometry (FT-IR) method, and an X-ray diffraction. An example using an aromatic polyimide film as a polymer film will be described below.

For example, in the case of a Raman measurement using a 532 nm-light as excitation light, a broad signal attributable to fluorescence of a polyimide is detected over an entire wide wave number range of from 100 $cm^{-1}$ to 4,000 $cm^{-1}$ attributable to fluorescence of a polyimide. When carbonization of an aromatic polyimide film advances, a peak appears at approximately from 900 $cm^{-1}$ to 1,800 $cm^{-1}$. The degree of advancement of carbonization can be evaluated by comparing the peak intensity of fluorescence originated from a polyimide and the peak intensity at from 900 $cm^{-1}$ to 1,800 $cm^{-1}$ attributable to carbon.

When a structure of a polyimide is present in a film, an IR peak characteristic of a structure of a polyimide appears. Meanwhile, a carbon structure absorbs infrared light over a wide wave number range and does not show a characteristic peak shape. Therefore, when a polyimide is carbonized, decrease in the peak intensity attributable to a polyimide structure is recognized. Consequently, as seen above, degree of advancement of carbonization can be also assessed by measuring a FT-IR peak attributable to a polyimide.

Further, degree of advancement of carbonization can be also estimated by using both Raman measurement and FT-IR measurement. For example, when in a FT-IR spectrum a peak characteristic of a polyimide disappears, and in a Raman spectrum a broad fluorescence peak disappears and a peak appears at approximately from 900 $cm^{-1}$ to 1,800 $cm^{-1}$, it can be regarded that a polyimide in a film has been carbonized.

Further, by performing a Raman measurement, it is possible to distinguish, for example, whether a region consisting of a carbon material has a graphite structure or an amorphous carbon structure. In the case of a graphite structure, a substantially single and sharp peak is recognized near 1,580 $cm^{-1}$. As the structure of a carbon material is disordered and approaching an amorphous state, a peak intensity near 1,360 $cm^{-1}$ increases and the peak becomes broader. From the above, it is possible to distinguish a structure of an amorphous carbon, which is favorably formed by heating a polymer film to a temperature of from 600° C. to 1,000° C. As a structure of an amorphous carbon, the ratio of the intensity of the peak at 1,360 $cm^{-1}$ to the intensity of the peak at 1,580 $cm^{-1}$ in a Raman spectrum is preferably 0.1 or more, and more preferably 0.3 or more.

Physical Properties of Pellicle Membrane (Concerning Heat Dissipation Performance and Thermal Resistance)

As described above, during EUV light irradiation, the energy of EUV light is converted to heat through various relaxation processes. Therefore, for a pellicle membrane, heat dissipation performance and thermal resistance are required. A pellicle membrane including a film, at least the central portion of which consists of a carbon material, has both heat dissipation performance and thermal resistance, and therefore there is a low risk of breakage of a pellicle membrane during EUV lithography. Therefore, an original plate can be securely guarded by using a pellicle membrane including a film, the central portion of which consists of a carbon material, while a conventional pellicle membrane consisting of single-crystal silicon has drawbacks that it has low heat dissipation performance and is easily deformed or broken due to thermal damages during EUV light irradiation. Reasons why a pellicle membrane including a film, the central portion of which consists of a carbon material (hereinafter also referred to as "carbon membrane") has both heat dissipation performance and thermal resistance will be described below.

The heat dissipation performance of a carbon membrane is determined mainly by (i) the radiation property of the carbon membrane (release of energy by infrared light), and (ii) the thermal conductivity of the carbon membrane.

(i) There is the following relational Equation (1) among the emissivity ε of a carbon membrane (radiation property), temperature T of a carbon membrane during EUV light irradiation, irradiation intensity P of EUV light, EUV transmittance Tr of a carbon membrane, Stefan-Boltzmann constant σ, and wall temperature Tw (internal temperature of an EUV light irradiation apparatus). In the relational Equation (1), the thermal conductivity of a carbon membrane is assumed to be 0.

$$T = \left( \frac{P \cdot (1 - Tr)}{\varepsilon \cdot \sigma} + T_W^4 \right)^{1/4} \quad (1)$$

Figure 4:
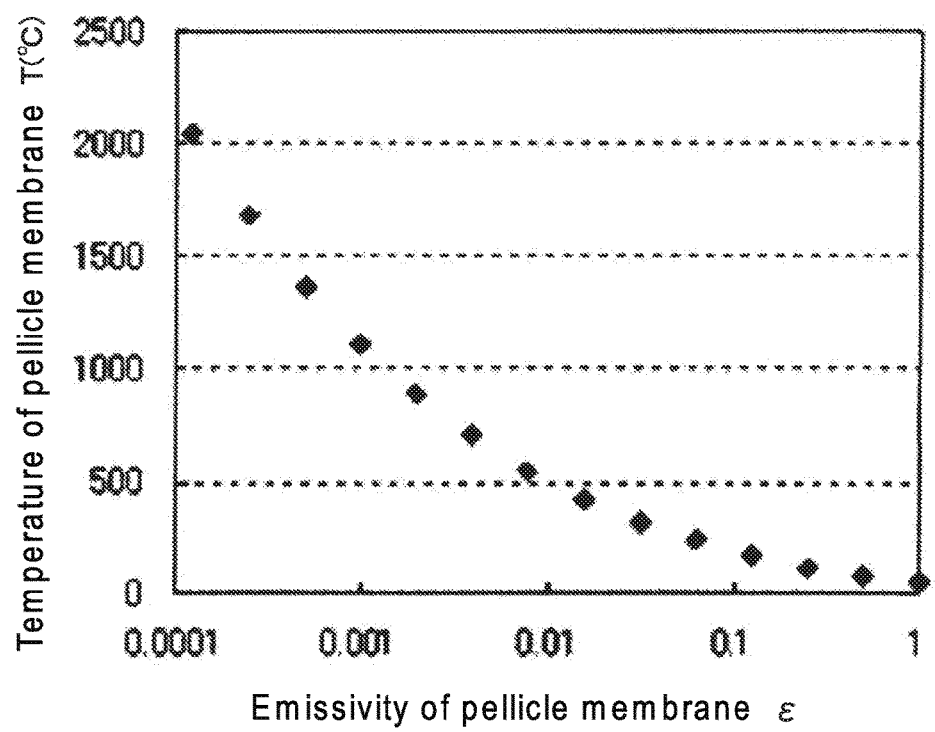
FIG. 4 is a graph showing the relationship between the temperature T of a pellicle membrane and the emissivity ε of the pellicle membrane.

FIG. 4 is a graph showing the relationship between "temperature T of a carbon membrane" and "emissivity ε of a carbon membrane" determined from Equation (1), wherein an EUV transmittance Tr of a carbon membrane is set at 80%, and the irradiation intensity P of EUV light is set at 100 W/cm² in the graph. As shown in FIG. 4, it is clear that the larger the emissivity ε of a carbon membrane becomes, the lower the temperature T of a carbon membrane becomes.

Figure 5:
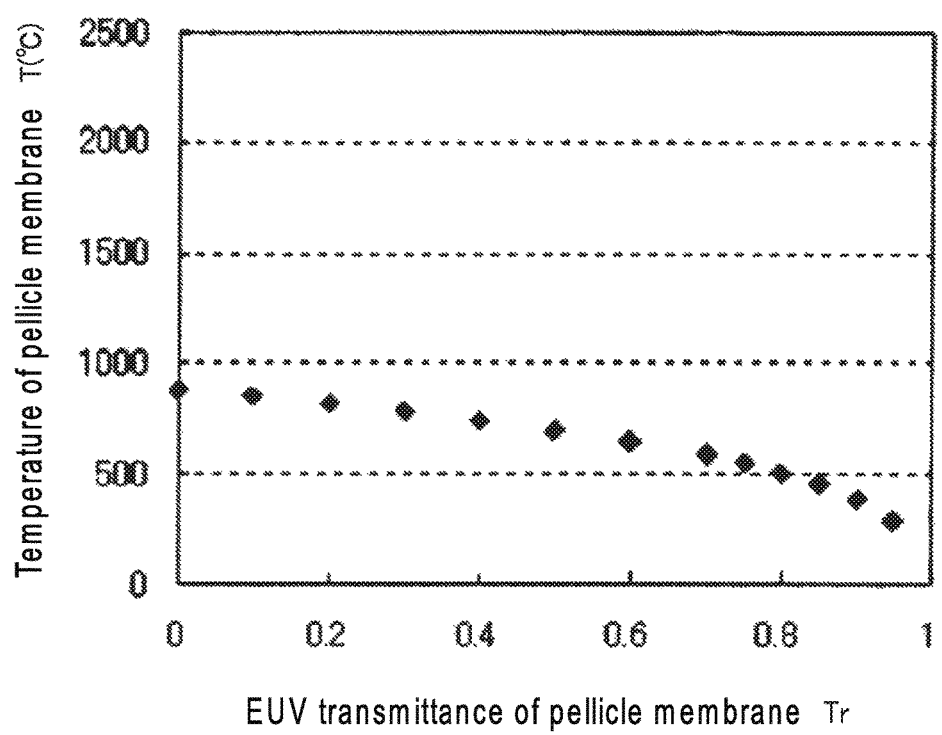
FIG. 5 is a graph showing the relationship between the temperature T of a pellicle membrane and the transmittance Tr of the pellicle membrane.

Meanwhile, FIG. 5 is a graph showing the relationship between "temperature T of a carbon membrane" and "transmittance Tr of a carbon membrane" determined from Equation (1), wherein the emissivity ε of a carbon membrane is set at 0.01, and the irradiation intensity P of EUV light is set at 100 W/cm² in the graph. As shown in FIG. 5, when the transmittance Tr of a carbon membrane changes, the temperature T of a carbon membrane changes slightly; however the amount of the change is small. In other words, temperature T of a carbon membrane is not substantially dependent on EUV transmittance Tr of a carbon membrane, but is strongly dependent on emissivity ε of a carbon membrane.

In this regard, it is difficult to determine experimentally the emissivity ε of a carbon membrane. But according to Kirchhoff's law, in a membrane having a higher infrared light absorptance, the emissivity ε becomes higher. Therefore, the radiation property of a carbon membrane can be estimated to some extent from a far infrared absorption spectrum of a pellicle membrane.

An infrared absorption of single-crystal silicon, which constitutes a conventional pellicle membrane, includes only absorption attributable to stretching vibration mode of a Si—Si bond, and the infrared light absorptance is low. Therefore, a single-crystal silicon membrane exhibits a low radiation property.

On the other hand, a carbon material constituting a carbon membrane exhibits absorption attributable to a C—H bond and strong absorption attributable to a $sp^2$ carbon bond, and the infrared light absorptance is high. Therefore, the carbon membrane exhibits a high radiation property.

(ii) The thermal conductivity of a pellicle membrane is determined by the thermal conductivity of a material constituting the membrane. The thermal conductivity of single-crystal silicon is from 150 W/mK to 170 W/mK. Meanwhile, the thermal conductivity of a graphite membrane, which is an example of a carbon membrane, is from 1,000 W/mK to 5,000 W/mK. Namely, the thermal conductivity of a carbon membrane such as a graphite membrane is high, while the thermal conductivity of a pellicle membrane consisting of single-crystal silicon is low.

Since, as seen in the above, a single-crystal silicon membrane, which is a conventional pellicle membrane, is inferior in both of (i) radiation property, and (ii) thermal conductivity, it is obvious that the heat dissipation performance is insufficient. In contrast, a carbon membrane according to the embodiment is superior in both of (i) radiation property, and (ii) thermal conductivity. Therefore, its heat dissipation performance is very high.

The thermal resistance of a pellicle membrane is determined by the melting point of a material constituting the pellicle membrane. The melting point of a carbon membrane such as graphite is 3,600° C., while the melting point of single-crystal silicon is 1,410° C.

In other words, a carbon membrane such as a graphite membrane is remarkably superior to a conventional pellicle membrane consisting of single-crystal silicon in terms of thermal resistance.

(EUV Permeability and Thickness of Pellicle Membrane)

With respect to a pellicle membrane according to the embodiment, the EUV light transmittance of a region consisting of an inorganic material is preferably high, such that the transmittance of light to be used for EUV lithography (for example, light with a wavelength of 13.5 nm, or light with a wavelength of 6.75 nm) is preferably 50% or more, more preferably 80% or more, and still more preferably 90% or more. In a case in which a pellicle membrane is layered with an oxidation prevention layer, the light transmittance of a membrane including the two is preferably 50% or more.

The light transmittance Tr of a pellicle membrane is measured with a photodiode. Specifically, it is calculated according to the following Equation (2) from a current value (incident light intensity $I_0$) detected in a state where a pellicle membrane is not mounted, and a current value (transmitted light intensity I) detected in a state where a pellicle membrane is mounted.

$$Tr = I/I_0 \quad (2)$$

The thickness of a pellicle membrane is preferably determined taking the light transmittance of a pellicle membrane, the infrared light absorptance of a pellicle membrane, and the strength and self-supporting property of a pellicle membrane, into consideration. A preferable thickness of a pellicle membrane is approximately from 10 nm to 120 nm, and in a case in which a support material is provided, approximately from 9 nm to 110 nm.

Uniformity of the thickness or the surface roughness of a pellicle membrane is not important insofar as a trouble due to nonuniformity of transmittance or scattering of EUV light originated from nonuniformity of the membrane thickness or the surface roughness does not occur in a patterning step by EUV exposure.

There may be a wrinkle on a pellicle membrane insofar as a trouble due to decrease or nonuniformity in transmittance or scattering originated from a wrinkle does not occur in a patterning step by EUV exposure.

There is the relationship of the following Equation (3) between the EUV transmittance Tr of a pellicle membrane and the thickness d of a pellicle membrane.

$$Tr = I/I_0 = \exp(-\mu\rho d) \qquad (3)$$

I: Transmitted light intensity of a pellicle membrane, $I_0$: Incident light intensity, d: Thickness of a pellicle membrane, $\rho$: Density, $\mu$: Mass absorption coefficient of a pellicle membrane The density $\rho$ in Equation (3) is the inherent density of a substance constituting a pellicle membrane. The mass absorption coefficient $\mu$ in Equation (3) is determined as follows. In a case in which the energy of a photon is higher than approximately 30 eV, and the energy of a photon is sufficiently apart from the absorption edge of an atom, the mass absorption coefficient $\mu$ is not dependent on a bonding state between the atoms or the like. For example, the energy of a photon with a wavelength of 13.5 nm is approximately 92.5 eV, and sufficiently apart from the absorption edge of an atom. Therefore, the mass absorption coefficient $\mu$ is not dependent on a bonding state between the atoms of a compound constituting the pellicle membrane. Consequently, the mass absorption coefficient $\mu$ of a pellicle membrane can be calculated from the following Equation (4) from the mass absorption coefficient $\mu_1$ of each element (1, 2, . . . , i) constituting a pellicle membrane, and the mass fraction $W_i$ of each element.

$$\mu = \mu_1 W_1 + \mu_2 W_2 + \ldots \mu_i W_i \qquad (4)$$

The $W_i$ is a value calculated by $W_i = n_i A_i / \Sigma n_i A_i$. $A_i$ is the atomic weight of each element i, and $n_i$ is the number of each element i.

As the mass absorption coefficient $\mu_i$ of each element in Equation (4), a value listed in the following reference edited by Henke, et al. may be utilized (B. L. Henke, E. M. Gullikson, and J. C. Davis, "X-Ray Interactions: Photoabsorption, Scattering, Transmission, and Reflection at E=50-30,000 eV, Z=1-92," At. Data Nucl. Data Tables 54, 181 (1993); the newest version of the values is published at http://www.cxro.lbl.gov/optical_constants/).

In other words, when the mass absorption coefficient $\mu$ of a pellicle membrane and the density $\rho$ of the film are specified, a preferable thickness d of a pellicle membrane can be determined based on a desired EUV transmittance Tr.

(Concerning Stress in Pellicle Membrane)

A stress may remain in a pellicle membrane which is obtained by forming a thin membrane on a substrate such as a silicon wafer. When a residual stress in a pellicle membrane is large, there is a risk that the stress may generate a crack, or cause breakage during use as a self-supporting membrane, and therefore the residual stress in a pellicle membrane is preferably small. The direction and the magnitude of a residual stress in a pellicle membrane can be measured by measuring the direction and the magnitude of a warpage of a substrate with a formed membrane. The direction and the magnitude of a warpage of a substrate with a formed membrane can be measured, for example, using a displacement measuring apparatus utilizing laser light, specifically using a three-dimensional shape measuring apparatus (NH-3SP, Mitaka Kohki Co., Ltd.) or the like. The magnitude of a residual stress in a pellicle membrane is desirably 1 GPa or less, more desirably 0.5 GPa or less, and still more desirably 0.2 GPa or less.

A residual stress is desirably a stress in a stretching direction. In a case in which a residual stress is in a stretching direction, a tension is imposed on a membrane, and therefore a self-supporting membrane free of wrinkle can be obtained. On the other hand, in a case in which a residual stress is in a compressing direction, a compressing force is imposed on a membrane, and therefore a wrinkle is generated. By suppression of a wrinkle in a membrane, variation in the thickness of a membrane is suppressed and EUV transmittance can be made more uniform, and the membrane can be made more resistant to breakage to be caused by an external force such as vibration.

(Evaluation on EUV Resistance of Pellicle Membrane)

EUV resistance can be evaluated by irradiating a pellicle membrane with EUV light, and performing various analyses on an irradiated portion and a non-irradiated portion. For example, a technique for composition analysis, such as an XPS measurement, an EDS analysis, or RBS; a technique for structure analysis, such as XPS, EELS, an IR measurement, or Raman spectroscopy; a membrane thickness analysis method, such as ellipsometry, interference spectroscopy, or X-ray reflectometry; and an appearance or surface shape evaluation method, such as microscopic observation, SEM observation, or AFM observation, can be applied. A heat dissipation performance can be investigated more precisely by combining an analysis result of a computer simulation.

For a pellicle membrane, an evaluation on resistance of p Hide membrane may be conducted by appropriately selecting a method, such as vacuum ultraviolet light irradiation, ultraviolet-visible light irradiation, infrared light irradiation, electron beam irradiation, plasma irradiation, or a heat treatment, corresponding to an evaluation item without limitation to EUV light.

(Concerning Evaluation of Membrane Strength of Pellicle Membrane)

Examples of an evaluation method of the strength of a pellicle membrane on a substrate include an evaluation method with a nano indenter. As an evaluation method for the membrane strength of a self-supporting membrane, a resonance method, a bulge test method, a method of examining existence or nonexistence of membrane breakage by an air-blow, a method of examining existence or nonexistence of membrane breakage by a vibration test, or the like may be applied.

Pellicle

A pellicle according to the embodiment includes a pellicle membrane according to the embodiment, and a support material supporting the pellicle membrane.

Since a pellicle according to the embodiment is provided with a pellicle membrane according to the embodiment, the same effects as a pellicle membrane according to the embodiment can be obtained.

Figure 6:
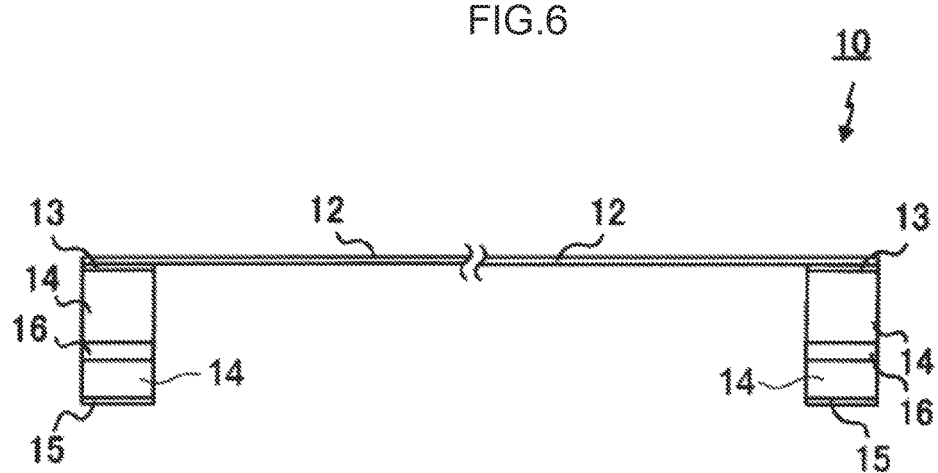
FIG. 6 is a schematic cross-sectional view of a pellicle according to the embodiment.

A pellicle according to the embodiment will be described below referring to FIG. 6. FIG. 6 is a schematic cross-sectional view showing a pellicle 10 according to the embodiment. A pellicle 10 is configured by a pellicle membrane 12 and a support frame 14, which are bonded together through a membrane adhesive layer 13, and in the support frame 14, an air hole 16 as well as an adhesive layer for an original plate 15 are formed.

Support Frame

The support frame (pellicle frame) 14 is for supporting the pellicle membrane 12.

Meanwhile, a portion of the pellicle membrane 12 according to the embodiment supported by the support frame 14 is preferably a region containing an organic material. By this configuration, a region containing an organic material of the pellicle membrane 12 is fixed at a portion supported by the support frame 14, and transmitted light can pass through a region consisting of an inorganic material when irradiated with exposure light.

There is no particular restriction on the material, shape, and the like of a support frame, insofar as the frame can support a pellicle membrane according to the embodiment through a membrane adhesive layer or the like. Examples of a support frame include frames made of aluminum, stainless steel, polyethylene, and ceramics. For example, it is preferable for the support frame 14 to have an air hole 16 for equalizing the pressure of a region surrounded by a pellicle 10 and an original plate (not illustrated) and the pressure of the inside of an EUV exposure apparatus as shown in FIG. 6. Since exposure to EUV light is carried out in a vacuum environment (reduced pressure environment), when the air pressure during exposure is not equalized, the pellicle membrane 12 may expand or contract, or break due to a pressure difference. The air hole 16 is preferably provided with a filter so that a foreign substance does not enter the region surrounded by a pellicle 10 and an original plate. Examples of a filter include a ULPA (Ultra Low Penetration Air) filter, and a metal mesh. A support frame 14 may be colored for facilitating inspection, to the extent not to interfere with exposure.

There is no particular restriction on a procedure or a method for fixing a pellicle membrane to a support frame. An etched substrate may be used as a part of support frame. A pellicle membrane may be layered, for example, on a substrate which may be removed by a specific treatment method, such as a metal, a silicon wafer, glass, a resin, or a salt, and thereafter a mask may be provided in accordance with the size of a frame on a surface of a substrate opposite to a surface provided with a pellicle membrane, and then the substrate may be etched or dissolved leaving the mask shape. By this process, a pellicle using a part of the substrate as a support frame can be obtained.

There is no particular restriction on a trimming method for fitting the substrate shape with the frame shape. In a case in which a silicon wafer is used, a method for dividing a wafer mechanically, or a laser trimming method may be applied.

Membrane Adhesive Layer

A membrane adhesive layer 13 is a layer for bonding a support frame 14 and a pellicle membrane 12. A membrane adhesive layer 13 may be a layer composed, for example, of an acrylic resin adhesive, an epoxy resin adhesive, a polyimide resin adhesive, a silicone resin adhesive, or an inorganic adhesive. From a viewpoint of retention of vacuum during EUV exposure, a membrane adhesive layer 13 preferably outgases little. For evaluating outgassing, for example, a thermal desorption spectrometer may be used.

There is no particular restriction on a method for fixing a pellicle membrane to a support frame, and a pellicle membrane may be directly bonded to a support frame, a membrane adhesive layer present at an edge of a support frame may be utilized, or a pellicle membrane may be fixed to a support frame utilizing a mechanical fixing method, or an attractive force of a magnet or the like.

As an evaluation method for an adhesive property of a pellicle membrane with a support frame, a method of examining existence or nonexistence of membrane breakage or detachment by an air-blow, in which, for example, a pressure, an area, a distance, or an angle is changed, or a method of examining existence or nonexistence of membrane breakage or detachment by a vibration test, in which an acceleration or an amplitude is changed, may be applied.

Adhesive Layer for Original Plate

An adhesive layer for an original plate 15 is a layer for bonding a support frame 14 and an original plate. As shown in FIG. 6, an adhesive layer for an original plate 15 is provided at an end on the side of the support frame 14, where a pellicle membrane 12 is not fixed. An adhesive layer for an original plate 15 is, for example, a double-sided adhesive tape, a silicone resin adhesive, an acrylic adhesive, a polyolefin adhesive, or an inorganic adhesive. From a viewpoint of retention of vacuum during EUV exposure, an adhesive layer for an original plate 15 preferably outgases little. For evaluating outgassing, for example, a thermal desorption spectrometer may be used.

Since a membrane adhesive layer 13 and an adhesive layer for an original plate 15 are exposed to scattered EUV light in an EUV exposure apparatus, they are desirably resistant to EUV. When the EUV resistance is low, the adhesiveness or strength of an adhesive is deteriorated during exposure, and a trouble, such as detachment of an adhesive, or generation of a foreign substance, occurs in an exposure apparatus. With respect to an evaluation on resistance to EUV light irradiation, for example, a technique for composition analysis, such as an XPS measurement, an EDS analysis, or RBS; a technique for structure analysis, such as XPS, EELS, an IR measurement, or Raman spectroscopy; a membrane thickness analysis method, such as ellipsometry, interference spectroscopy, or X-ray reflectometry; an appearance or surface shape evaluation method, such as microscopic observation, SEM observation, or AFM Observation; and a strength and adhesiveness evaluation method, such as a nano indenter, or a separation test, can be applied.

In lithography, a circuit pattern is required to be transferred accurately. Therefore, the transmittance of exposure light in an exposure range is required to be substantially uniform. By using a pellicle membrane 12 according to the embodiment, a pellicle 10 having a constant light transmittance in an exposure range can be obtained.

(Use of Pellicle)

A pellicle according to the invention may be used not only as a protection member for inhibiting a foreign substance from sticking to an original plate in an EUV exposure apparatus, but also as a protection member for protecting an original plate during storage of an original plate, or transportation of an original plate. For example, in a state in which a pellicle is mounted on an original plate (original plate for exposure), when the original plate is removed from an EUV exposure apparatus, it can be, for example, stored as it is. Examples of a method for mounting a pellicle on an original plate include a bonding method with an adhesive, an electrostatic adsorption method, and a mechanical fixing method.

Variation 1

Figure 7:
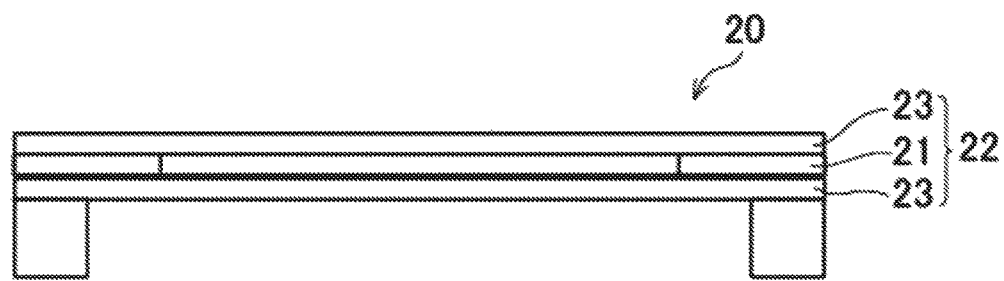
FIG. 7 is a schematic cross-sectional view of a variant of a pellicle according to the embodiment.

Next, a variation of a pellicle 20 according to the embodiment will be described referring to FIG. 7. As shown in FIG. 7, a pellicle membrane 22 constituting a pellicle 20 may be layered with oxidation prevention layers 23 on both surfaces of a film 21, in which a region containing an organic material and a region consisting of an inorganic material are present. When a film 1 is layered with oxidation prevention layers 23, oxidation of a pellicle membrane 22 is inhibited during EUV light irradiation or storage of a pellicle. In this regard, an oxidation prevention layer may be layered only on a single surface of a film.

Variation 2

A pellicle according to the embodiment may also be a pellicle comprising a pellicle membrane including a film containing a polyimide compound (preferably, a film consisting of a polyimide compound) and a support frame supporting the pellicle membrane. By applying high energy to a film containing a polyimide compound as described above, a polyimide compound in an energized region is carbonized, so that a pellicle having a pellicle membrane having both a region containing a polyimide (a not energized region) and a region consisting of a carbon material (an energized region) in the same plane can be obtained.

Original Plate for Exposure

An original plate for exposure according to the embodiment comprises an original plate and a pellicle according to the embodiment mounted on the original plate.

Since an original plate for exposure according to the embodiment is provided with a pellicle according to the embodiment, the same effect as a pellicle according to the embodiment can be obtained.

There is no particular restriction on a method for mounting an original plate on a pellicle according to the embodiment. For example, an original plate may be directly bonded to a support frame 14, an adhesive layer for an original plate 15 at an edge of a support frame 14 may be utilized, or an original plate may be fixed to a support frame 14 utilizing a mechanical fixing method, or an attractive force of a magnet or the like.

In this regard, as an original plate, an original plate comprising a support substrate, a reflection layer layered on the support substrate, and an absorber layer formed on the reflection layer, may be used. Since an absorber layer absorbs a part of EUV light, a desired image is formed on a sensitive substrate (for example, a semiconductor substrate with a photoresist membrane). A reflection layer may be a multilayer membrane of molybdenum (Mo) and silicon (Si). An absorber layer may be a material highly absorptive for EUV light or the like, such as chromium (Cr) or tantalum nitride.

Exposure Apparatus

An exposure apparatus according to the embodiment is provided with an original plate for exposure according to the embodiment.

Therefore, the exposure apparatus exerts the same effect as unoriginal plate for exposure according to the embodiment.

An exposure apparatus according to the embodiment is provided with a light source that emits exposure light (preferably EUV light or the like, more preferably EUV light. The same shall apply hereinbelow), an original plate for exposure according to the embodiment, and an optical system that guides exposure light emitted from the light source toward the original plate for exposure, and the original plate for exposure is preferably disposed such that the exposure light emitted from the light source passes through the pellicle membrane and irradiate the original plate.

According to this embodiment, a fine pattern (for example, line width 32 nm or less) can be formed with EUV light or the like, and further even when EUV light, which is apt to cause a trouble of poor resolution due to a foreign substance, is used, pattern exposure, in which poor resolution due to a foreign substance is mitigated, can be performed.

Method of Producing Semiconductor Device

A method of producing a semiconductor device according to the embodiment comprises: a step of causing exposure light emitted from a light source to pass through the pellicle membrane of the original plate for exposure according to the embodiment, irradiate the original plate, and be reflected from the original plate; and a step of causing the exposure light reflected from the original plate to pass through the pellicle membrane and irradiate a sensitive substrate, thereby patternwise exposing the sensitive substrate.

By a method of producing a semiconductor device according to the embodiment, even when EUV light, which is apt to cause a trouble of poor resolution due to a foreign substance, is used, a semiconductor device, in which poor resolution due to a foreign substance is mitigated, can be produced.

Figure 8:
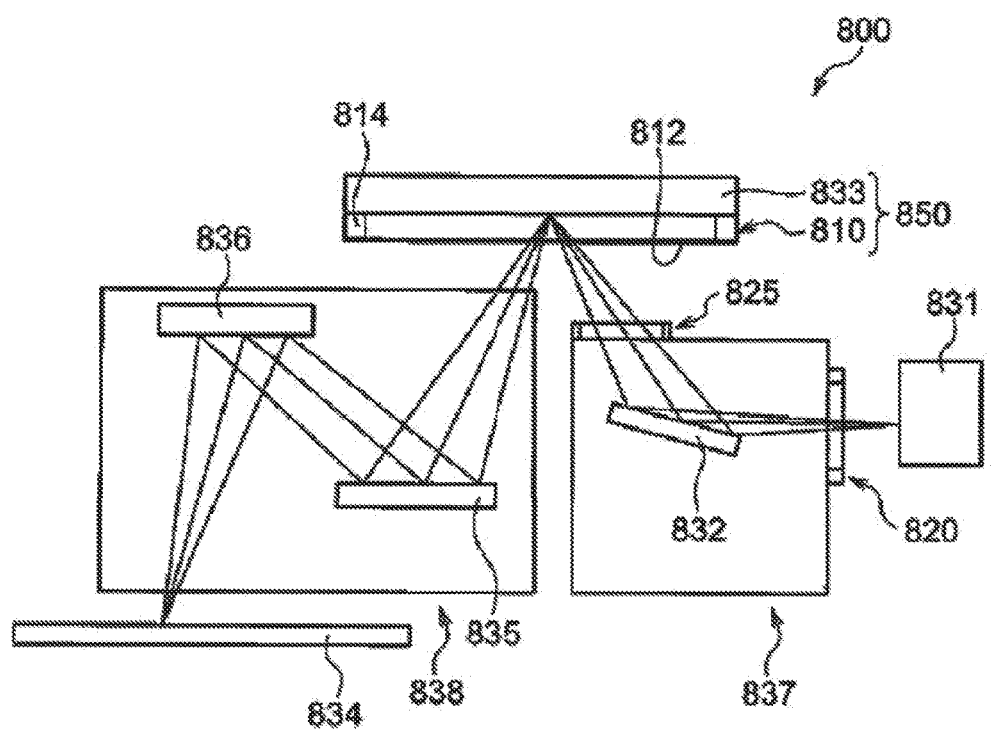
FIG. 8 is a schematic cross-sectional view of an EUV exposure apparatus, which is an example of an exposure apparatus according to the embodiment.

FIG. 8 is a schematic cross-sectional view of an EUV exposure apparatus 800, which is an example of an exposure apparatus according to the embodiment.

As shown in FIG. 8, an EUV exposure apparatus 800 is provided with a light source 831 that emits EUV light, an original plate for exposure 850, which is an example of an original plate for exposure according to the embodiment, and an illumination optical system 837 that guides EUV light emitted from the light source 831 toward the original plate for exposure 850.

The original plate for exposure 850 is provided with a pellicle 810 including a pellicle membrane 812 and a support frame 814, and an original plate 833. The original plate for exposure 850 is disposed such that the EUV light emitted from the light source 831 passes through the pellicle membrane 812 and irradiates the original plate 833.

The original plate 833 patternwise reflects the irradiated EUV light.

The support frame 814 and the pellicle 810 are respectively examples of a support frame and a pellicle according to the embodiment.

In the EUV exposure apparatus 800, filter windows 820 and 825 are disposed between the light source 831 and an illumination optical system 837, and between an illumination optical system 837 and the original plate 833 respectively.

Further, the EUV exposure apparatus 800 is provided with a projection optical system 838 that guides the EUV light reflected by the original plate 833 toward a sensitive substrate 834.

In the EUV exposure apparatus 800, the EUV light reflected by the original plate 833 is guided through the projection optical system 838 onto the sensitive substrate 834, so that the sensitive substrate 834 is patternwise exposed. In this regard, exposure by the EUV is carried out in a reduced pressure condition.

The EUV light source 831 emits EUV light toward the illumination optical system 837.

The EUV light source 831 includes a target material, a pulse laser irradiation unit, and the like. The target material is irradiated with pulse laser for generating plasma to obtain EUV. When the target material is Xe, EUV with a wavelength of from 13 nm to 14 nm is obtained. The wavelength of light emitted from an EUV light source is not limited to from 13 nm to 14 nm, and any light with a wavelength suitable for the purpose within a range of wavelength of from 5 nm to 30 nm may be applied.

The illumination optical system 837 condenses the light irradiated from the EUV light source 831, equalizes the illuminance, and irradiates the original plate 833.

The illumination optical system 837 includes a plurality of multilayer membrane mirrors 832, optical integrators, and the like, for regulating the path of EUV light. A multilayer membrane mirror is, for example, a multilayer membrane in which molybdenum (Mo) and silicon (Si) are layered alternately one on another.

There is no particular restriction on a method for mounting filter windows 820 and 825, and examples thereof include a method of bonding it with an adhesive or the like, and a method of fixing it mechanically to the inside of an EUV exposure apparatus.

The filter window 820 disposed between the light source 831 and the illumination optical system 837 captures a scattered particle (debris) generated from the light source, so as to prohibit the scattered particle (debris) from sticking to a device in the illumination optical system 837 (for example, a multilayer membrane mirror 832).

Meanwhile, the filter window 825 disposed between the illumination optical system 837 and the original plate 833 captures a particle (debris) scattered from the side of the light source 831, so as to prohibit the scattered particle (debris) from sticking to the original plate 833.

A foreign substance stuck to an original plate absorbs or scatters EUV light and therefore causes poor resolution on a wafer. Therefore, the pellicle 810 is so mounted as to cover an area of the original plate 833 to be irradiated with EUV light. The EUV light passes through the pellicle membrane 812 and irradiates the original plate 833.

The EUV light reflected from the original plate 833 passes through the pellicle membrane 812, and irradiates the sensitive substrate 834 through the projection optical system 838.

The projection optical system 838 condenses the light reflected from the original plate 833 and irradiates the sensitive substrate 834. The projection optical system 838 includes a plurality of multilayer membrane mirrors 835, 836, and the like for regulating the path of EUV light.

The sensitive substrate 834 is a substrate in which a resist is coated on a semiconductor wafer, or the like, and the resist is cured patternwise by the EUV reflected from the original plate 833. By developing the resist, and etching the semiconductor wafer, a desired pattern is formed on the semiconductor wafer.

The pellicle 810 is mounted on the original plate 833 through an adhesive layer for an original plate, or the like. A foreign substance stuck to an original plate absorbs or scatters EUV and therefore causes poor resolution on a wafer. Therefore, the pellicle 810 is so mounted as to cover an area of the original plate 833 to be irradiated with EUV light, wherein the EUV passes through the pellicle membrane 812 and irradiates the original plate 833.

There is no particular restriction on a method for mounting a pellicle 810 on an original plate 833, insofar as it is a method able to mount a pellicle on an original plate while prohibiting a foreign substance from sticking to an original plate surface, and examples thereof include a method of bonding a support frame 814 and an original plate 833 with an adhesive, an electrostatic adsorption method, and a mechanical fixing method. Preferably, a bonding method with an adhesive is applied.

EXAMPLES

The invention will be described more specifically below by way of Examples, provided that the invention is not limited to the Examples.

Example 1

On a silicon wafer with a diameter of 4 inches, a polyimide membrane consisting of PMDA-ODA (pyromellitic anhydride, and 4,4'-diaminodiphenyl ether) with a thickness of 110 nm was formed. The formed polyimide membrane was separated from the silicon wafer and bonded to a support frame (2.0 mm-wide) made of an aluminum alloy A7075 with an acrylic adhesive.

Only the central portion of the polyimide membrane was irradiated with EUV light with an intensity of 150 mW/cm$^2$ and a wavelength of 13.5 nm continuously for 100 min, such that a portion of the polyimide membrane contacting the support frame was not irradiated with the EUV light, thereby carbonizing the polyimide membrane. As an EUV light source, the EUV light irradiation apparatus (NewSUBARU (facility name) BL-10, University of Hyogo) was used, and the irradiation direction of EUV was vertical to the membrane surface. The beam size determined from the full width at half maximum of incident light intensity was 0.15 mm×0.8 mm. After carbonization of the polyimide membrane, a FT-IR measurement and a Raman measurement were performed.

For the FT-IR measurement, a microscopic FT-IR apparatus FTS-6000/UMA-500 (produced by Bio-Rad Laboratories, Inc.) was used under measurement conditions of: atmospheric environment: the atmosphere; resolution: 4 cm$^{-1}$; integration number: 128; and measurement area: 100 μm×100 μm. For the Raman measurement, a Raman microscope (XPLORA, produced by Horiba, Ltd.) was used under measurement conditions of: atmospheric environment: the atmosphere, excitation light: 532 nm; grating: 6001; and measurement range: 400 cm$^{-1}$ to 3,200 cm$^{-1}$.

Figure 9:
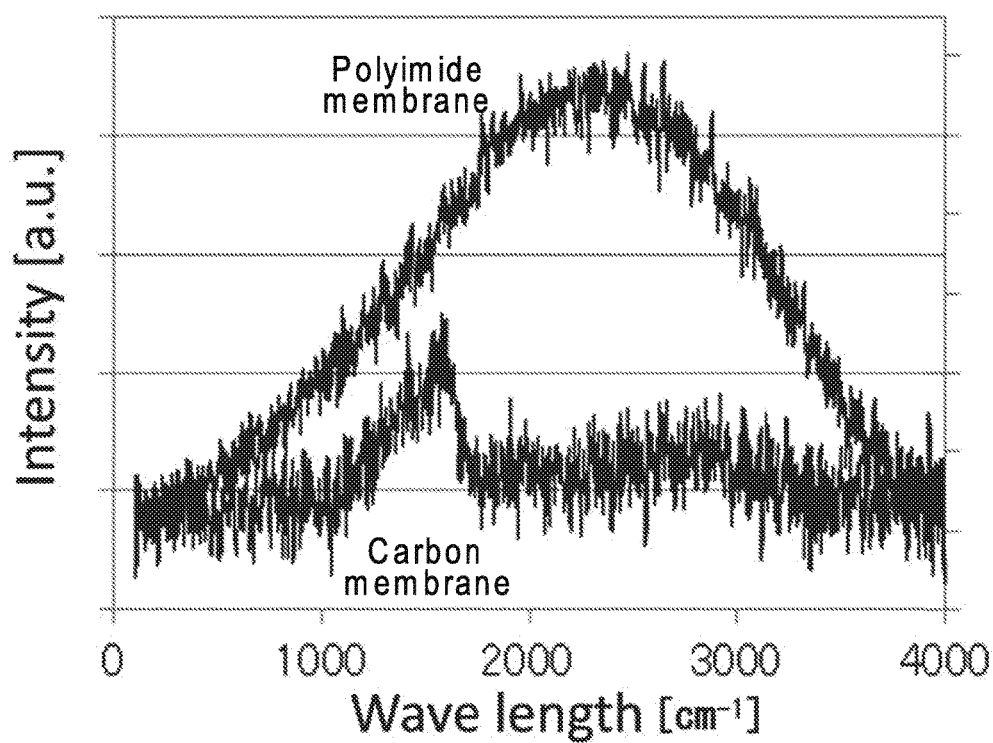
FIG. 9 shows results of Raman measurements on a polyimide membrane before carbonization, and a carbon membrane (a region irradiated with EUV light).
Figure 10:
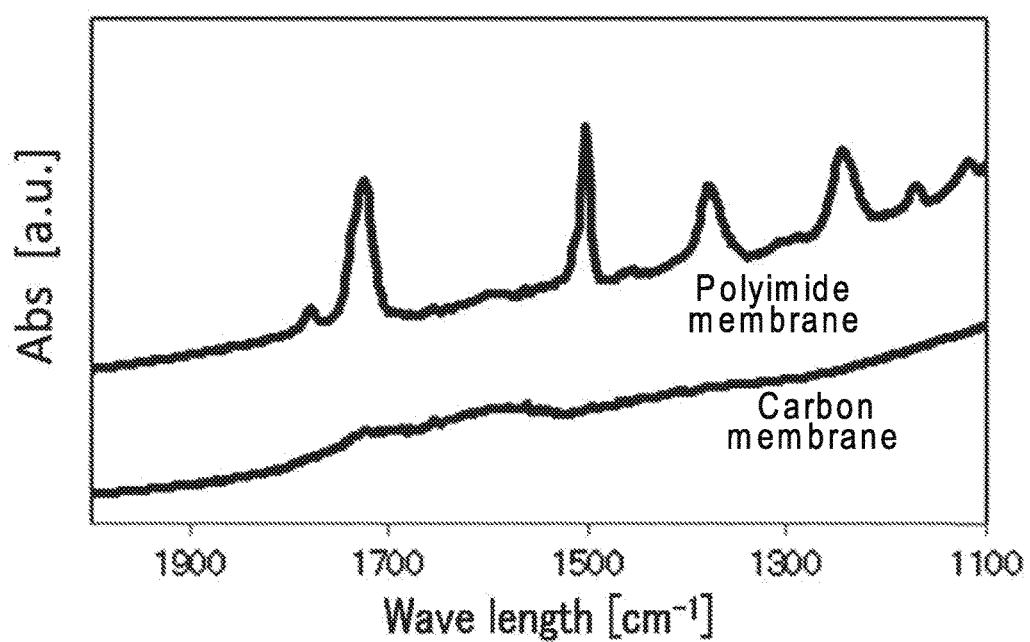
FIG. 10 shows results of FT-IR measurements on a polyimide membrane before carbonization, and a carbon membrane (a region irradiated with EUV light).

The results of Raman spectrum and IR spectrum on a polyimide membrane before carbonization and a carbon membrane (a region irradiated with EUV light) are shown in FIGS. 9 and 10. As shown in FIGS. 9 and 10, signals originated from the structure and the fluorescence characteristic of a polyimide disappeared in the carbon membrane, and a signal characteristic of carbon appeared in a wave number range of from 900 cm$^{-1}$ to 1,800 cm$^{-1}$, whereby it was confirmed that the central portion of the polyimide membrane was changed to a carbonized carbon membrane.

The carbon membrane was irradiated with EUV light with an intensity of 150 mW/cm$^2$ continuously for 280 min. Then confirmation of discoloration of the portion irradiated with EUV light, measurement of EUV transmittance, and confirmation of EUV transmittance stability and change in a Raman spectrum after EUV light irradiation were performed.

Figure 11:
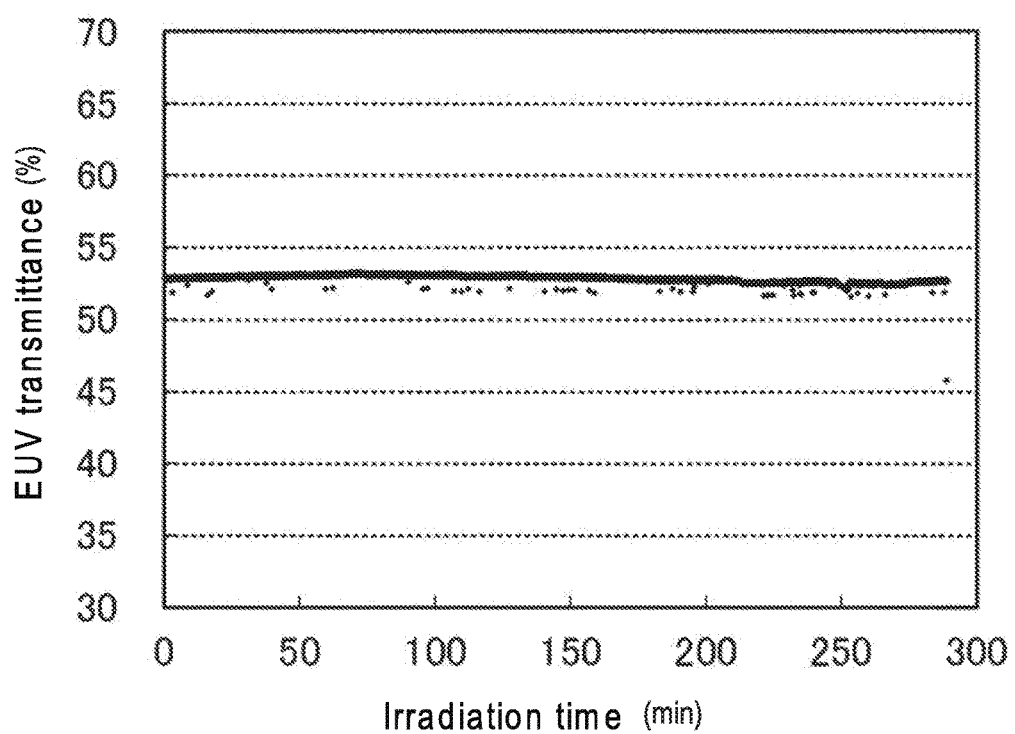
FIG. 11 shows results concerning the EUV transmittance during irradiation of a carbon membrane with EUV light.

The results of the EUV transmittance during EUV light irradiation for 280 min were shown in FIG. 11. As shown in FIG. 11, the EUV transmittance of a carbon membrane remained constant to indicate high resistance to EUV (durability). Further, even after EUV light irradiation, the shape of a self-supporting membrane was maintained, and there was no particular change in appearance or a Raman spectrum.

Example 2

Firstly, as in Example 1, a polyimide membrane was formed, and the formed polyimide membrane was bonded to a support frame (2.0 mm-wide) with an acrylic adhesive.

Only the central portion of the polyimide membrane was irradiated with an ArF light (ultraviolet light) with an intensity of 2 W/cm$^2$ and a wavelength of 193 nm continuously for 5 min, such that a portion of the polyimide membrane contacting the support frame was not irradiated with the ultraviolet light, thereby carbonizing the polyimide membrane. The irradiation direction of ultraviolet light was vertical to the membrane surface. The beam size determined from the full width at half maximum of the incident light intensity was 5 mm mm. After carbonization of the polyimide membrane, a FT-IR measurement and a Raman measurement were performed under the same conditions as in Example 1.

As for the results of Raman spectrum and IR spectrum on a polyimide membrane before carbonization and a carbon membrane (a region irradiated with ultraviolet light), similarly to Example 1, signals originated from the structure and the fluorescence characteristic of a polyimide disappeared, and a signal characteristic of carbon appeared in a wave number range of from 900 cm$^{-1}$ to 1,800 cm$^{-1}$, whereby it was confirmed that the central portion of the polyimide membrane was changed to a carbonized carbon membrane.

Comparative Example 1

A copper foil was prepared, and a graphene membrane was produced on the copper foil by a CVD method using a mixed gas of $CH_4$, $H_2$, and Ar. A PET (poly(ethylene terephthalate)) film was layered on the obtained graphene membrane. The layered body was dipped in dilute hydrochloric acid to dissolve and remove the copper foil. Thereafter, the layered body of a PET film and graphene was immersed in hexafluoroisopropanol to dissolve and remove the PET film. However, in dissolving the PET film, the graphene membrane was broken, and a self-supporting pellicle membrane was not obtained.

The disclosure of Japanese Patent Application No. 2014-103411, filed May 19, 2014, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A pellicle membrane, comprising a film consisting of an organic material and an inorganic material, wherein a region containing the organic material and a region consisting of the inorganic material are present in the same plane of the film, and wherein at least a central portion of the film is the region consisting of the inorganic material, and at least a peripheral edge portion of the film is the region containing the organic material.

2. The pellicle membrane according to claim 1, wherein the region containing the organic material is a region consisting of the organic material.

3. The pellicle membrane according to claim 1, wherein at least one of a glass transition temperature or a melting point of the organic material is 150° C. or higher.

4. The pellicle membrane according to claim 1, wherein the organic material is at least one compound selected from the group consisting of a polyimide compound, a polyacrylonitrile compound, a polyisocyanate compound, a polyamide compound, a heteroaromatic ring compound, a polyphenylene resin, a polyether resin, a liquid crystal polymer resin, a poly(para-xylylene) resin, a phenol resin, an epoxy resin, and a furan resin.

5. The pellicle membrane according to claim 1, wherein an aromatic ring equivalent of the organic material is from 3 mmol/g to 15 mmol/g.

6. The pellicle membrane according to claim 1, wherein the organic material is a polyimide compound.

7. The pellicle membrane according to claim 6, wherein the polyimide compound is an aromatic polyimide including a repeating unit represented by the following General Formula (1):

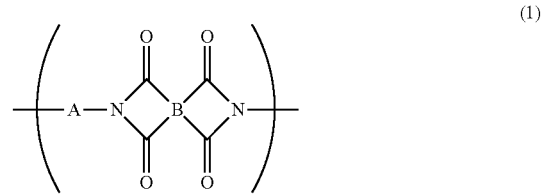

wherein, in General Formula (1), A is a divalent group derived from a diamine selected from the group consisting of m-phenylenediamine, o-phenylenediamine, p-phenylenediamine, 3,3'-diaminodiphenyl ether, 3,4'-diaminodiphenyl ether, 4,4'-diaminodiphenyl ether, 3,3'-diaminodiphenyl sulfone, 4,4'-diaminodiphenyl sulfone, 3,3'-diaminobenzophenone, 3,3'-diaminodiphenylmethane, 4,4'-diaminodiphenylmethane, 1,3-bis(3-aminophenoxy)benzene, 1,3-bis(4-aminophenoxy)benzene, and 4,4'-bis(3-aminophenoxy)biphenyl; and B is a tetravalent group derived from a tetracarboxylic dianhydride selected from the group consisting of pyromellitic dianhydride, 3,3',4,4'-biphenyltetracarboxylic dianhydride, 2,3,3',4-biphenyltetracarboxylic dianhydride, 3,3',4,4'-benzophenone tetracarboxylic dianhydride, 4,4'-oxydiphthalic dianhydride, and 3,3',4,4'-diphenylsulfone tetracarboxylic dianhydride.

8. The pellicle membrane according to claim 1, wherein the inorganic material is a carbon material.

9. The pellicle membrane according to claim 1, further comprising a layer consisting of an inorganic material, on at least one side of the film.

10. A pellicle, comprising:
the pellicle membrane according to claim 1; and
a support frame supporting the pellicle membrane.

11. The pellicle according to claim 10, wherein a portion of the pellicle membrane that is supported by the support frame is the region containing the organic material.

12. An original plate for exposure, comprising:
an original plate; and
the pellicle according to claim 10 mounted on the original plate.

13. An exposure apparatus, comprising the original plate for exposure according to claim 12.

14. An exposure apparatus, comprising:
a light source that emits exposure light;

the original plate for exposure according to claim 12; and an optical system that guides the exposure light emitted from the light source toward the original plate for exposure, wherein the original plate for exposure is disposed such that the exposure light emitted from the light source passes through the pellicle membrane and irradiates the original plate.

15. The exposure apparatus according to claim 14, wherein the exposure light is EUV light.

16. A method of producing a semiconductor device, the method comprising:

a step of causing exposure light emitted from a light source to pass through the pellicle membrane of the original plate for exposure according to claim 12, irradiate the original plate, and be reflected from the original plate; and a step of causing the exposure light reflected from the original plate to pass through the pellicle membrane and irradiate a sensitive substrate, thereby patternwise exposing the sensitive substrate.

17. The method of producing a semiconductor device according to claim 16, wherein the exposure light is EUV light.

\* \* \* \* \*